(12) United States Patent
Takemura

(10) Patent No.: US 8,553,447 B2
(45) Date of Patent: Oct. 8, 2013

(54) SEMICONDUCTOR MEMORY DEVICE AND DRIVING METHOD THEREOF

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 98 days.

(21) Appl. No.: 13/236,982

(22) Filed: Sep. 20, 2011

(65) Prior Publication Data

US 2012/0081948 A1 Apr. 5, 2012

(30) Foreign Application Priority Data

Oct. 5, 2010 (JP) ................................. 2010-225566
Dec. 9, 2010 (JP) ................................. 2010-274168

(51) Int. Cl.
*G11C 11/24* (2006.01)
*G11C 11/404* (2006.01)

(52) U.S. Cl.
CPC .................................. *G11C 11/404* (2013.01)
USPC ...... 365/149; 365/104; 365/230.03; 365/226; 365/233.5

(58) Field of Classification Search
CPC ...... G11C 11/22; G11C 7/18; G11C 11/4097; G11C 16/28
USPC ..................................... 365/145, 230.03, 149
See application file for complete search history.

(56) References Cited

U.S. PATENT DOCUMENTS

| | | | |
|---|---|---|---|
| 4,777,625 | A | 10/1988 | Sakui et al. |
| 4,982,372 | A | 1/1991 | Matsuo |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,574,148 | B2 | 6/2003 | Chevallier |
| 6,727,522 | B1 | 4/2004 | Kawasaki et al. |
| 7,049,190 | B2 | 5/2006 | Takeda et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Thong Q Le
(74) *Attorney, Agent, or Firm* — Fish & Richardson P.C.

(57) ABSTRACT

In a conventional DRAM, errors in reading data are likely to occur when the capacitance of a capacitor is reduced. A plurality of cells is connected to one main bit line Each cell includes a sub bit line and 2 to 32 memory cells. Further, each cell includes a selection transistor and a reading transistor, and a sub bit line is connected to a gate of the reading transistor. Since the parasitic capacitance of the sub bit line is sufficiently small, data of electric charge of a capacitor of each memory cell can be amplified without an error in the reading transistor and output to the main bit line.

16 Claims, 13 Drawing Sheets

(56) References Cited

U.S. PATENT DOCUMENTS

| | | | |
|---|---|---|---|
| 7,061,014 B2 | 6/2006 | Hosono et al. |
| 7,064,346 B2 | 6/2006 | Kawasaki et al. |
| 7,088,603 B2 | 8/2006 | Patel |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0266925 A1 | 10/2008 | Lukes et al. |
| 2008/0285362 A1* | 11/2008 | Kang et al. ............... 365/189.16 |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0290262 A1 | 11/2010 | Scheuerlein et al. |
| 2011/0089419 A1 | 4/2011 | Yamazaki et al. |
| 2011/0101334 A1 | 5/2011 | Yamazaki et al. |
| 2011/0114946 A1 | 5/2011 | Saito |

FOREIGN PATENT DOCUMENTS

| | | | |
|---|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-042172 A | 2/2007 |
| JP | 2007-096055 A | 4/2007 |
| JP | 2007-123861 A | 5/2007 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

(56) References Cited

OTHER PUBLICATIONS

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amphoru In-Ga-Zn Oxide TFT," SID Digest '09 : SID International Symposium Digest of Techinal Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID, 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al. "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "Suftla Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3-Ga2ZnO4-ZnO system at 1350° C," Journal of Solid State Chemistry, Aug. 1, 1991, vol. 93, No. 2, pp. 298-315.
Nomura, K et al., "Thin-Fim Transistos Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) ,2006, vol. 45, No. 5B, pp. 4303-4308.
Nomura, K et al., "Room-Temperature Fabrication of Transparent Flexible Thin-Film Transistors Using Amorphous Oxide Semiconductora," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09: SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

OH, M et al., "Improving the Gate Stability of ZnO Thin-Fim Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park. S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Trabsistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kinam Kim; "Technology for sub-50nm DRAM and NAND Flash Manufacturing"; IEDM 05: Technical Digest of International Electron Devices Meeting; Dec. 5, 2005; pp. 333-336.

W. Mueller et al.; "Challenges for the DRAM Cell Scaling to 40nm"; IEDM 05: Technical Digest of International Electron Devices Meeting; 2005; pp. 347-350.

\* cited by examiner

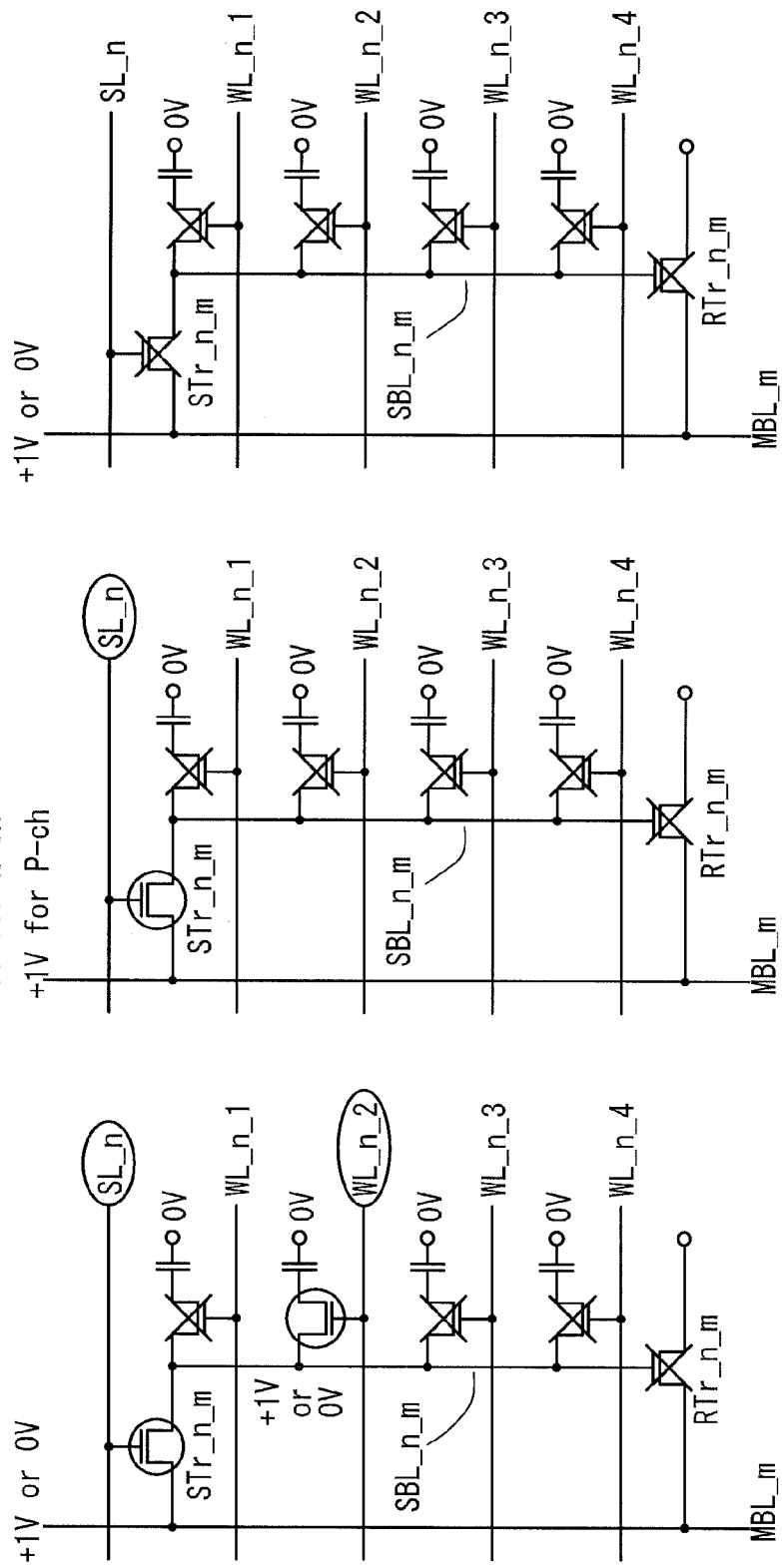

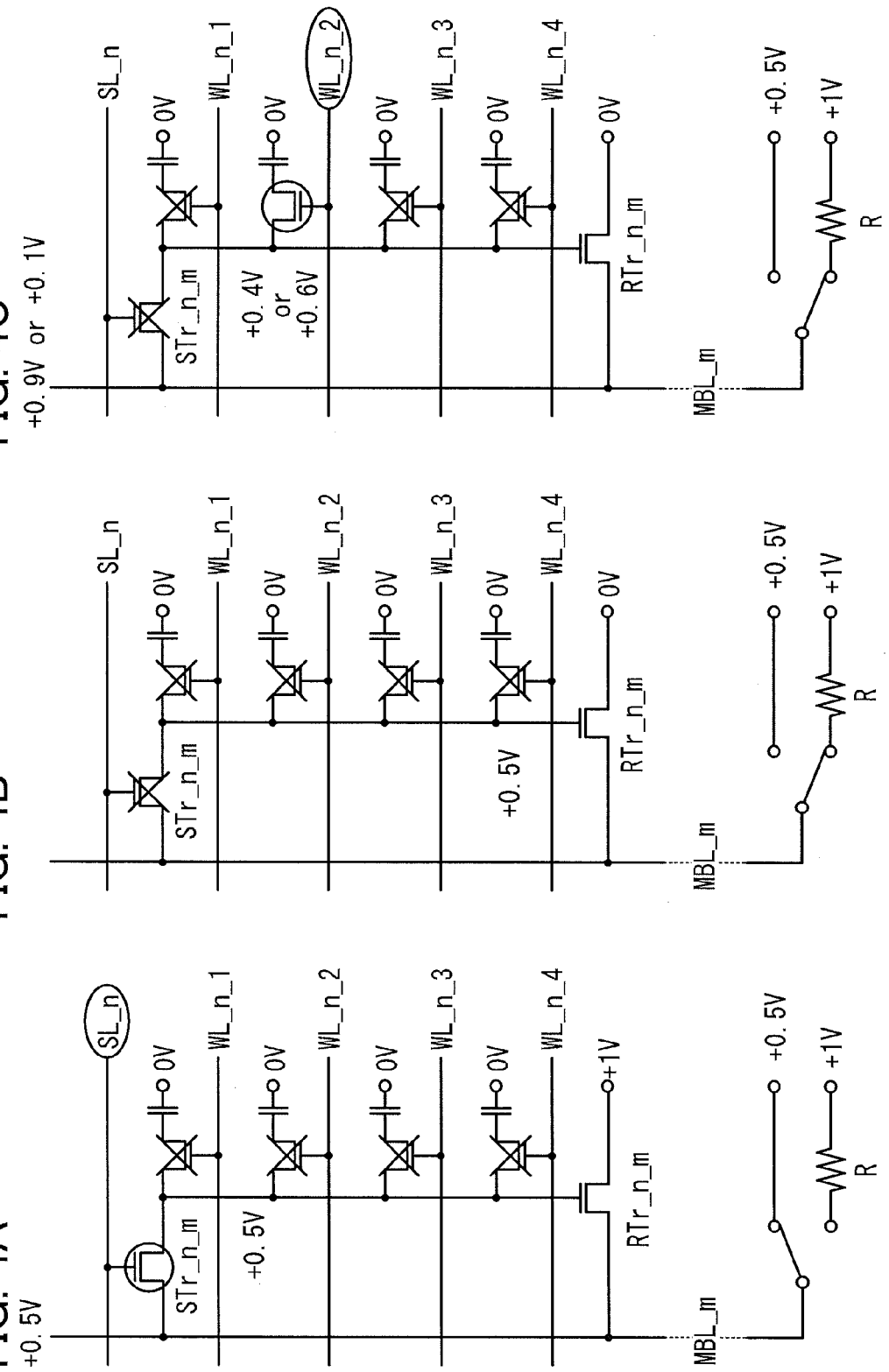

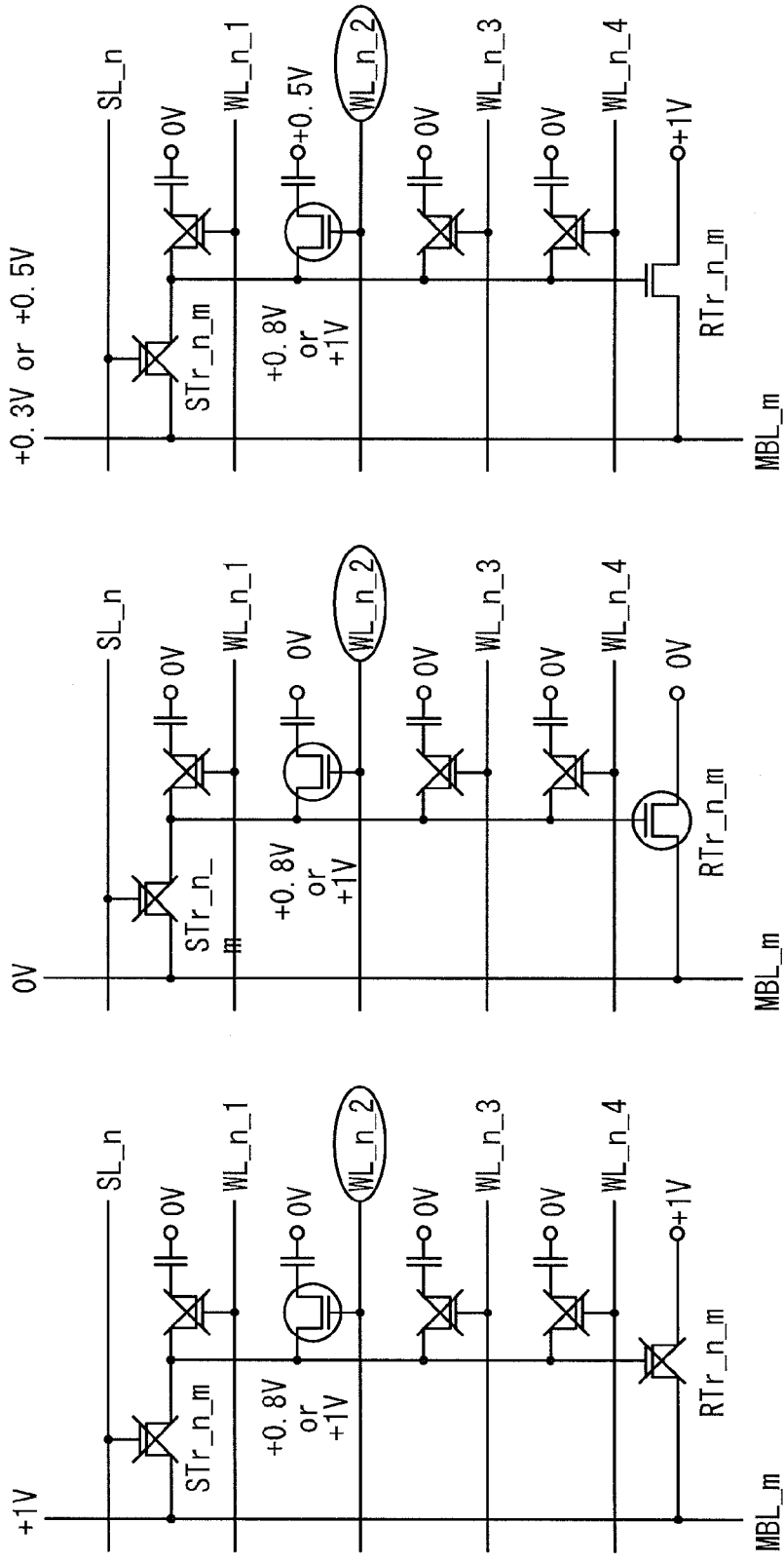

SEMICONDUCTOR MEMORY DEVICE AND DRIVING METHOD THEREOF

BACKGROUND OF THE INVENTION

1. Field of the Invention

The present invention relates to a memory device using a semiconductor.

2. Description of the Related Art

Terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Further, even when the expression "to be connected" is used in this specification, there is a case in which no physical connection is made in an actual circuit and a wiring is just extended. For example, in an insulated-gate field-effect transistor (hereinafter simply referred to as a transistor) circuit, there is a case in which one wiring serves as gates of a plurality of transistors. In that case, one wiring may have a plurality of branches to gates in a circuit diagram. In this specification, the expression "a wiring is connected to a gate" is also used to describe such a case.

Note that in this specification, in referring to a specific row, a specific column, or a specific position in a matrix, a reference sign is accompanied by a sign denoting coordinates as follows, for example: "a selection transistor STr_n_m", "a main bit line MBL_m", and "a sub bit line SBL_n_m". In the case where a row, a column, or a position is not specified, the case where elements are collectively referred to, or the case where the position is obvious, the following expressions may be used: "a selection transistor STr", "a main bit line MBL", and "a sub bit line SBL" or simply "a selection transistor", "a main bit line", and "a sub bit line".

A DRAM whose memory cell includes one transistor and one capacitor can be highly integrated, have no limit on the number of times of writing, and can perform writing and reading at relatively high speed; thus, such a DRAM is used in many kinds of electronic appliances. A DRAM stores data by accumulating electric charge in a capacitor of each memory cell, and reads the data by releasing the electric charge.

A conventional DRAM circuit is illustrated in FIG. 2. Similarly to the cases of other memory devices, memory cells are arranged in matrix. In FIG. 2, 14 memory cells in the n-th to the (n+6)-th rows and the m-th and the (m+1)-th columns and sense amplifiers AMP_m and AMP_m+1 used for reading are illustrated.

Hereinafter, the operation is briefly described. Data is written to the memory cells in the n-th row in the following manner. The potential of a word line WL_n is set to an appropriate potential (e.g., +1.8 V), so that transistors of the memory cells in the n-th row are turned on. Then, the potential of a bit line BL such as a bit line BL_m or a bit line BL_m+1 is set to a potential (e.g., +1 V or 0 V) in accordance with data. Thus, a capacitor of each memory cell is charged to the potential.

Data reading is more complex compared to data writing. First, the potentials of all the bit lines BL, including the bit lines BL_m and BL_m+1, are charged (precharged) to an appropriate potential (e.g., +0.5 V). In addition, a reference potential $V_{REF}$ of the sense amplifiers connected to the bit lines is set to the precharged potential (i.e., +0.5 V).

In that state, the potential of the word line WL in a row where reading is performed is set to an appropriate potential (e.g., +1.8 V), so that transistors of the memory cells in the row are turned on. Accordingly, the potential of the bit line BL changes in accordance with the potential of the capacitor of the memory cell. For example, in the case where the capacitor is charged to +1 V, the potential of the bit line BL is higher than +0.5 V. In the case where the capacitor is charged to 0 V, the potential of the bit line BL is lower than +0.5 V.

When the potential of the bit line BL is higher than +0.5 V, the potential of a data input-output terminal DATA of the sense amplifier becomes H, and when the potential of the bit line BL is lower than +0.5 V, the potential of the data input-output terminal DATA of the sense amplifier becomes L. Thus, data is read. A problem in the above operation is reading accuracy. When the parasitic capacitance (which is shown as CS_m or CS_m+1 in the drawing) of the bit line BL is smaller than the capacitance of the capacitor of the memory cell where reading is performed, the potential of the bit line BL becomes close to the potential of the capacitor and largely different from the reference potential $V_{REF}$.

On the contrary, when the parasitic capacitance of the bit line BL is larger than the capacitance of the capacitor of the memory cell, the potential of the bit line BL becomes less likely to be affected by the potential of the capacitor. For example, if the parasitic capacitance of the bit line BL is ten times as large as the capacitance of the capacitor, potential change is only approximately 0.05 V when electric charge accumulated in the capacitor is released to the bit line BL by turning on a transistor of the memory cell.

The smaller the difference between the potential of the bit line BL and the reference potential $V_{REF}$ is, the more easily errors occur in the sense amplifier. The bit line BL, which intersects with many wirings, has larger parasitic capacitance as its length becomes longer. As the capacitance of the capacitor becomes relatively smaller than the parasitic capacitance of the bit line BL, potential change becomes smaller; thus, an error easily occurs at the time of reading.

Although an occupied area by a memory cell tends to be reduced as miniaturization proceeds, the capacitance of a capacitor of the memory cell cannot be reduced because, as described above, a predetermined ratio of the capacitance of the capacitor to the parasitic capacitance of a bit line (or a sub bit line described below) needs to be kept. In other words, while an area in which a capacitor is formed is reduced, the capacitor has been required to have the same capacitance.

At present, a capacitor is formed to have a trench structure in which a deep hole is formed in a silicon wafer or a stack structure in which a chimney-like projection is provided (see Non Patent Documents 1 and 2). Both the hole and the projection are required to have an aspect ratio of 50 or more. That is, an extremely long and narrow structure body whose depth or height is 2 μm or more needs to be formed in a limited area, which is difficult to realize with high yield.

In order to overcome such a difficulty, a method is disclosed in which sub bit lines are provided for a bit line (also referred to as a main bit line to be distinguished from the sub bit lines) and a sense amplifier of a flip-flop circuit type is connected to each of the sub bit lines so that the capacitance of a capacitor is reduced (see Patent Document 1). However, the present inventor found that provision of a plurality of flip-flop circuits not only decreases the integration degree, but also leads to unstable operation and easy occurrence of an error when the capacitance, of a sub bit line, a capacitor connected to the sub bit line, input of a flip-flop circuit and the like (including parasitic capacitance), is 1 fF or less.

Such an error is mainly caused by noise. For example, a case is considered where the potential of a circuit is changed by some noise. When the amount of potential change causing noise is assumed to be constant, potential change in a circuit is inversely proportional to the capacitance of the circuit. That is, potential change caused by the noise can be ignored in the case where the capacitance of the circuit is large, but the potential greatly changes due to the noise in the case where the capacitance of the circuit is small.

In a usual DRAM, the capacitance of a bit line is several hundred IF or more. Thus, potential change of the bit line is limited even with very large noise. On the other hand, in a sub bit line with the capacitance of 1 fF, a potential change as large as 0.1 V or more is caused by noise which would cause a potential change as small as 1 mV in a usual bit line. In a sub bit line with the capacitance of 0.1 fF or less, potential change is as large as 1 V or more.

In many cases, such noise changes in a short time and an adverse effect of such noise can be removed by accumulating data for a long time and averaging the data. However, when a flip-flop circuit or the like is incorporated, an adverse effect of noise comes to the surface. This is because the flip-flop circuit is a positive feedback circuit in which output of a first inverter is input of a second inverter and output of the second inverter is input of the first inverter.

In a positive feedback circuit, once predetermined potential difference is observed, even if the potential difference is temporary, the potential difference is amplified and fixed thereafter. That is, noise (mainly, thermal noise) which does not cause a problem in a usual DRAM causes an error in a semiconductor memory device including a sub bit line whose capacitance is extremely small.

Furthermore, in the case where the capacitance connected to a flip-flop circuit is much smaller, by using a sub bit line or the like, than the capacitance of a usual bit line, the flip-flop circuit sensitively responds even to a change in potential within a very short period and fixes the potential. Thus, the DRAM disclosed in Patent Document 1 cannot be used in the case where the capacitance of a capacitor or the capacitance of a sub bit line is very small.

Further, when the capacitance of a capacitor is 10 fF or less, influence of the capacitance of the input of the flip-flop circuit used for a sense amplifier cannot be ignored, which refers to, specifically, the capacitance of the gates of transistors connected to the input terminal or the like, and is usually 1 fF or smaller, although dependent on the size of the transistors.

The potential of a bit line changes by release of electric charge which is accumulated in a capacitor to the bit line (or a sub bit line). Potential change in the bit line is caused also by change in the gate capacitance of transistors in a flip-flop circuit, which are turned on/off during operation of the flip-flop circuit.

In the case of a usual DRAM, the capacitance of a capacitor is much larger than the capacitance of the input of the flip-flop circuit. Thus, it can be considered that change in the potential of the bit line is largely due to the capacitor. However, when the capacitance of the capacitor is ten times as large as or less than the capacitance of the input of the flip-flop circuit, the flip-flop circuit is influenced by its gate capacitance and operation becomes unstable. In particular, in a condition where the capacitance of the capacitor is two times as large as or less than the capacitance of the input of the flip-flop circuit, it is almost impossible to control the flip-flop circuit in accordance with the capacitance of the capacitor.

Further, in a conventional semiconductor memory device including a sub bit line, for its structure in which off-current of a transistor of a memory cell cannot be sufficiently reduced, a reduction in the capacitance of a capacitor simply causes a problem of an increase in the frequency of refreshing (rewriting of data for the purpose of compensating a reduction in electric charge accumulated in a capacitor). For example, when the capacitance of the capacitor is 1 fF, which is one thirtieth of conventional capacitance, the frequency of refreshing needs to be 30 times as high as the conventional frequency of refreshing, in which case more power is consumed.

REFERENCE

Patent Document

[Patent Document 1] U.S. Pat. No. 4,777,625

Non-Patent Document

[Non-Patent Document 1] K. Kim, "Technology for sub-50 nm DRAM and NAND flash manufacturing", *Technical Digest of International Electron Devices Meeting*, pp. 333-336, 2005.

[Non-Patent Document 2] W. Muller et al., "Challenges for the DRAM cell scaling to 40 nm", *Technical Digest of International Electron Devices Meeting*, pp. 347-350, 2005.

SUMMARY OF THE INVENTION

An object of one embodiment of the present invention is to provide a memory device which sufficiently functions even when the capacitance of a capacitor is smaller than or equal to that in a conventional DRAM, specifically 1 fF or less, preferably 0.1 fF or less. An object of one embodiment of the present invention is to provide a memory device which sufficiently functions even when the capacitance of a capacitor is ten times as large as or less than the gate capacitance of a transistor used, preferably two times as large as or less than the gate capacitance of the transistor used. Further, an object of one embodiment of the present invention is to provide a memory device in which a depth or a height necessary for a capacitor is 1 μm or less, preferably 0.3 μm or less.

Further, an object of one embodiment of the present invention is to provide a memory device having a novel structure or a method for driving the memory device. Specifically, an object of one embodiment of the present invention is to provide a memory device in which power consumption can be reduced or a method for driving a memory device, in which power consumption can be reduced.

One embodiment of the present invention is a semiconductor memory device including one or more main bit lines, one or more power supply lines, four or more word lines, and two or more cells. Each of the cells includes two or more memory cells, a sub bit line, a selection transistor, and a reading transistor. A drain of the selection transistor and a drain of the reading transistor are connected to one of the main bit lines, and a gate of the reading transistor is connected to the sub bit line and a source of the reading transistor is connected to one of the power supply lines. Each of the memory cells includes one or more transistors and one or more capacitors. The capacitance of the capacitor is 1 fF or less. A gate of one of the transistors of each of the memory cells is connected to one of the word lines.

One embodiment of the present invention is a semiconductor memory device including a first main bit line and a second main bit line, one or more power supply lines, four or more word lines, and a first cell and a second cell. The first cell includes two or more memory cells, a first sub bit line, a first selection transistor, and a first reading transistor while the second cell includes two or more memory cells, a second sub bit line, a second selection transistor, and a second reading transistor. A drain of the first selection transistor and a drain of the first reading transistor are connected to the first main bit lines, and a source of the first selection transistor and a gate of the second reading transistor are connected to the first sub bit line and a source of the reading transistor is connected to one of the power supply lines. Each of the memory cells includes one or more transistors and one or more capacitors. The capacitance of the capacitor is 1 fF or less. A gate of one of the transistors of one of the memory cells is connected to one of the word lines.

One embodiment of the present invention is a method for driving a memory device including one or more main bit lines, one or more power supply lines, four or more word lines, and two or more cells. Each of the cells includes two or more memory cells, a sub bit line, a selection transistor, and a reading transistor. A drain of the selection transistor and a drain of the reading transistor are connected to one of the main bit lines, and a gate of the reading transistor is connected to the sub bit line and a source of the reading transistor is connected to one of the power supply lines. Each of the memory cells includes one or more transistors and one or more capacitors. The capacitance of the capacitor is 1 fF or less. A gate of one of the transistors of each of the memory cells is connected to one of the word lines. The method for driving the memory device includes a first step of setting the potential of the sub bit line to a specific potential by turning on the selection transistor, and a second step of turning on one of the transistors of one of the memory cells.

In the above, the selection transistor and one of the transistors of one of the memory cells may be provided in different layers. Further, a semiconductor used in the selection transistor and a semiconductor used in one of the transistors of one of the memory cells may be of different kinds. In the above, one of the transistors of one of the memory cells and one of the transistors of the other memory cell are provided in different layers.

In the above, the conductivity type of the reading transistor may be different from that of the selection transistor. The reading transistor may be a p-channel transistor. Moreover, one cell may include 2 to 32 memory cells. Furthermore, a necessary depth or a necessary height for the capacitor may be 1 μm or less, preferably 0.3 μm or less.

By employing any of the above-described structures, at least one of the above-described objects can be achieved. An effect of one embodiment of the present invention will be described with reference to FIG. 1. A circuit illustrated in FIG. 1 is part of the technical idea of the present invention. In FIG. 1, four cells in the n-th and the (n+1)-th rows and the m-th and the (m+1)-th columns are shown, where each of the cells includes four memory cells. Similarly to a conventional DRAM, each memory cell includes one transistor and one capacitor.

For reading, a sub bit line SBL_n_m is set to a state where an appropriate potential is kept and a selection transistor STr_n_m is turned off. A transistor in a memory cell where reading is performed is turned on in this state, whereby the potential of the sub bit line SBL_n_m changes in accordance with electric charge accumulated in a capacitor of the memory cell. Here, the sub bit line SBL_n_m is sufficiently short and its parasitic capacitance is thus sufficiently small as compared to the parasitic capacitance of the main bit line MBL_m. Accordingly, even when the capacitance of the capacitor of the memory cell is 1 fF or less, the potential of the sub bit line SBL_n_m changes by a sufficiently large amount.

Since the sub bit line SBL_n_m is connected to a gate of a reading transistor RTr_n_m, when the potential of the sub bit line SBL_n_m changes, the conduction state of the reading transistor RTr_n_m changes. In other words, the resistance value between a source and a drain of the reading transistor RTr_n_m is changed by a change in the potential of the sub bit line SBL_n_m. This change is immediately reflected on an increase and decrease in electric charge, or the potential, of the main bit line MBL_m.

It is needless to say that the resistance value between the source and the drain of the reading transistor RTr_n_m includes large noise when measured in an extremely short time; however, an adverse effect of the noise can be cancelled in a process of accumulating electric charge in the main bit line MBL_m whose capacitance is sufficiently large. That is, a memory device having a function equivalent to a conventional DRAM, even with the use of a smaller capacitor than that of the conventional DRAM, can be manufactured.

Such a small capacitor makes it unnecessary to form a structure body with a high aspect ratio, which is included in a conventional DRAM. In a conventional DRAM, there is not only a problem of difficulty in manufacturing such a structure body, but also a problem of great difficulty in improving the memory density by manufacturing a memory device having a multilayer structure. When one embodiment of the present invention in which such a structure body is not needed is utilized in view of the above problem, a multilayer technique in which a memory cell is stacked over a memory cell can be realized.

BRIEF DESCRIPTION OF THE DRAWINGS

FIGS. 3A to 3C are diagrams illustrating an example of a driving method of a semiconductor memory device of the present invention.

FIGS. 4A to 4C are diagrams illustrating an example of a driving method of a semiconductor memory device of the present invention.

FIGS. 5A to 5C are diagrams illustrating an example of a driving method of a semiconductor memory device of the present invention.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Embodiment 1

In this embodiment, a semiconductor memory device illustrated in FIG. 1 and an example of its operation are described with reference to FIGS. 3A to 3C, FIGS. 4A to 4C, and FIGS. 5A to 5C. Note that specific values are given below as potentials for the purpose of aid for understanding a technical idea of the present invention. Needless to say, such values are changed in accordance with various characteristics of a transistor, a capacitor, or the like, or for convenience of the practitioner. Further, the semiconductor memory device described in this embodiment can write or read data using a method other than a method described below.

Figure 1:
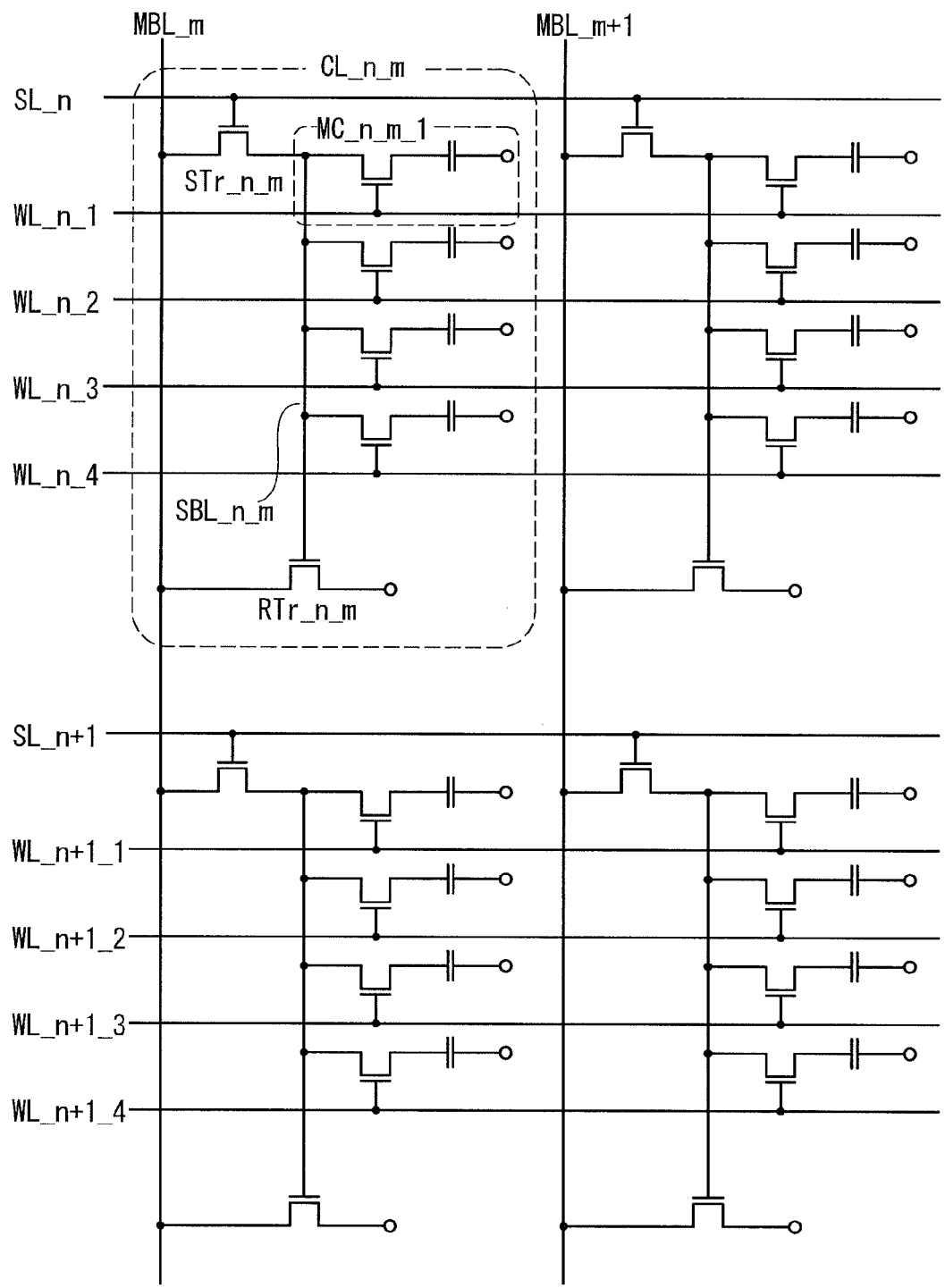
FIG. 1 is a diagram illustrating an example of a semiconductor memory device of the present invention.
Figure 2:
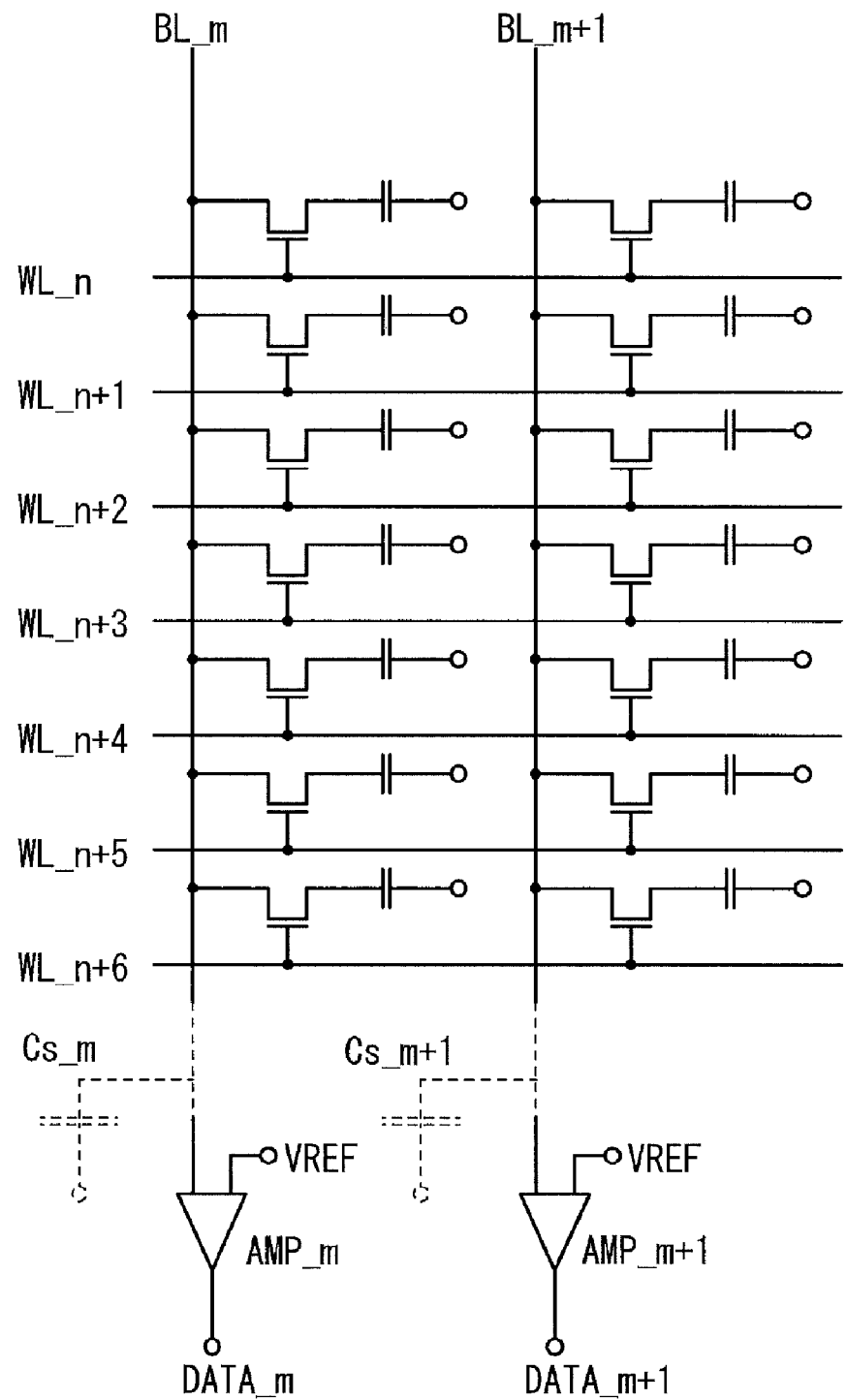
FIG. 2 is a diagram illustrating an example of a conventional semiconductor memory device (DRAM).
Figure 6A:
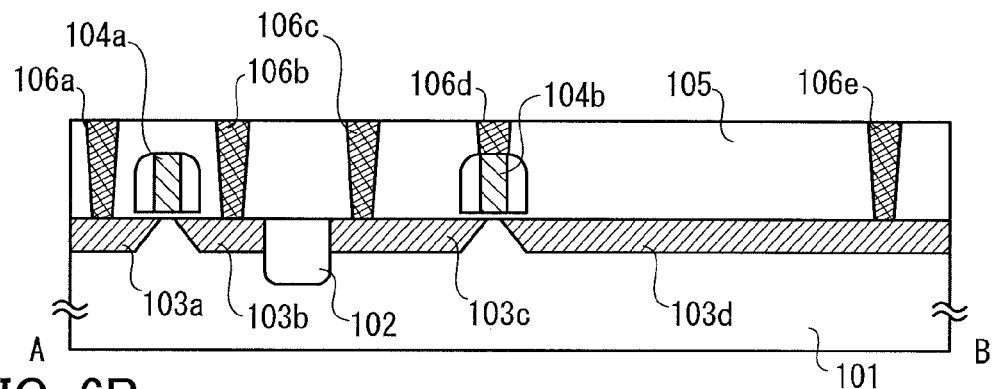
FIGS. 6A to 6C illustrate an example of a manufacturing process of a semiconductor memory device of the present invention.
Figure 6B:
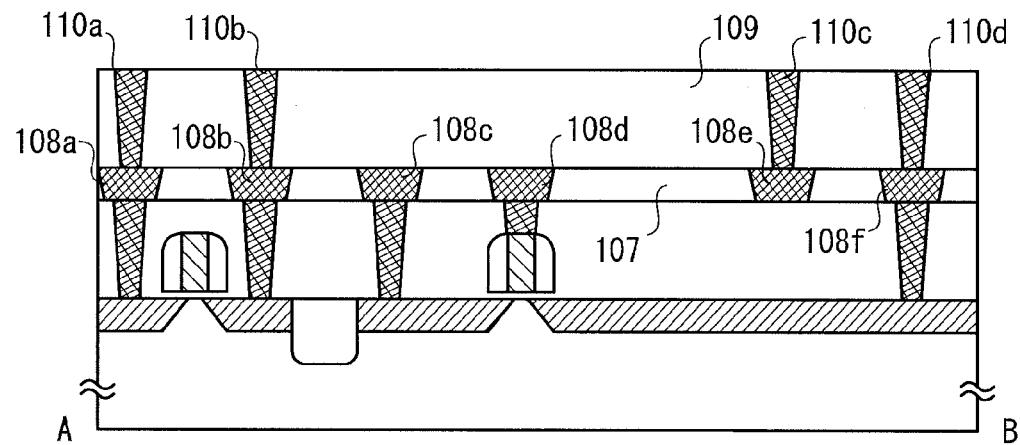
Figure 6C:
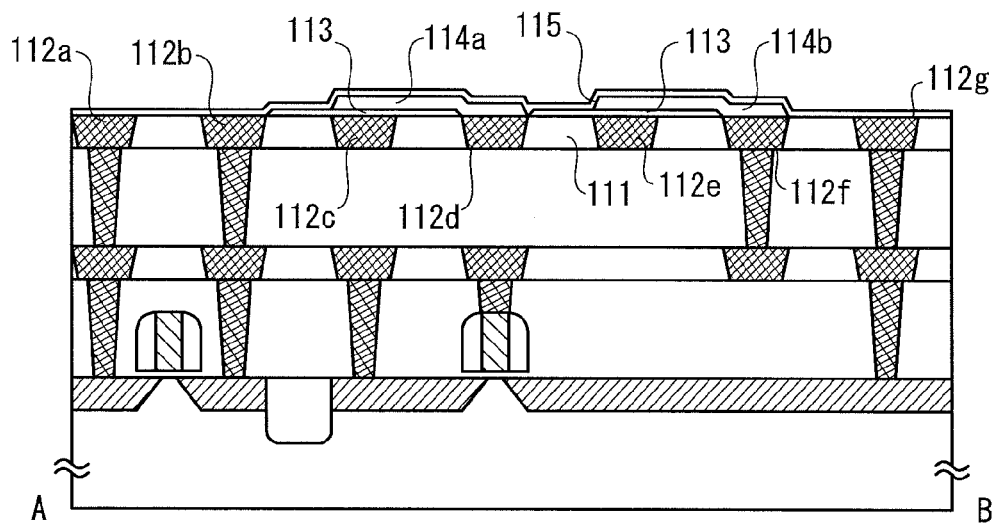

The semiconductor memory device illustrated in FIG. 1 includes word lines WL, main bit lines MBL perpendicular to the word lines, selection lines SL parallel to the word lines, and a plurality of cells. Each cell includes a selection transistor STr, a reading transistor RTr, a sub bit line SBL, and a plurality of memory cells MC.

Four memory cells MC are provided in each cell in FIG. 1. The cell in the n-th row and the m-th column illustrated in FIG. 1 (CL_n_m) includes a memory cell MC_n_m_1, a memory cell MC_n_m_2, a memory cell MC_n_m_3, and a memory cell MC_n_m_4, from the top.

Each memory cell includes one transistor and one capacitor similarly to a conventional DRAM, but may include two or more transistors or two or more capacitors. It is preferable that a drain of the transistor of the memory cell be connected to the sub bit line SBL, a source of the transistor be connected to one electrode of the capacitor, and a gate of the transistor be connected to one of the word lines WL.

A drain of the selection transistor STr and a drain of the reading transistor RTr are connected to one of the main bit lines MBL, a source of the selection transistor STr and a gate of the reading transistor RTr are connected to the sub bit line SBL, and a gate of the selection transistor STr is connected to one of the selection lines.

Any of a variety of semiconductors can be used for the selection transistor STr, the reading transistor RTr, and the transistor included in the memory cell MC. For example, all those transistors can be formed using the same semiconductor material. For example, those transistors may be formed using a single crystal silicon semiconductor substrate.

Alternatively, the selection transistor STr and the reading transistor RTr may be manufactured using a single crystal silicon semiconductor substrate, and the transistor included in the memory cell MC may be formed using a semiconductor layer in a thin film shape. In that case, for the semiconductor layer in a thin film shape, single crystalline silicon, polycrystalline silicon, or a semiconductor other than silicon, an example of which is an oxide semiconductor, may be used.

Particularly in the case of an oxide semiconductor having a band gap of three electron volts or more, by making the concentration of donors or acceptors $1\times10^{12}$ cm$^{-3}$ or lower, the resistance in an off-state can be extremely high. In other words, by optimizing the potential of a gate, the resistance between a source and a drain can be $1\times10^{24}\Omega$ or higher. For example, even when the capacitance of a memory cell is 0.01 fF, which is less than or equal to one thousandth of the capacitance of a memory cell of a conventional DRAM, a time constant is $1\times10^{7}$ seconds (115 days), and data can be held for a long period, which cannot be assumed in a conventional DRAM.

In other words, refreshing which needs to be performed ten times per second or more in a conventional DRAM becomes unnecessary in a usual usage.

For data writing in a DRAM, much of current flowing in a main bit line is used for charging and discharging of parasitic capacitance between the main bit lines in addition to for charging of a capacitor of a memory cell. Since parasitic capacitance between the main bit lines increases as the wiring width decreases, in the present situation of higher integration, the current ten times as high as or more than the current needed for charging of the capacitor of the memory cells is used for charging and discharging of the parasitic capacitance between the main bit lines.

Needless to say, charging and discharging of parasitic capacitance between the main bit lines is a phenomenon not related to data holding, and performing refreshing leads an increase in power consumption. Therefore, a reduction in the number of times of refreshing or omission of refreshing is effective in suppressing power consumption.

The reading transistor RTr may have the same conductivity type as or a different conductivity type from the selection transistor STr. For example, both the selection transistor STr and the reading transistor RTr may be n-channel transistors or p-channel transistors, or the selection transistor STr may be an n-channel transistor and the reading transistor RTr may be a p-channel transistor. Alternatively, the selection transistor STr may be a p-channel transistor and the reading transistor RTr may be an n-channel transistor.

The number of the memory cells MC included in one cell is four in FIG. 1 and the number of the memory cells MC included in one cell is preferably 2 to 32. As the number of the memory cells increases, the length of the sub bit line SBL increases, which leads larger parasitic capacitance. When the capacitance of the capacitor of the memory cell MC is constant, a ratio of the capacitance of the capacitor of the memory cell MC to parasitic capacitance of the sub bit line SBL decreases; thus, the amount of change in the potential of the sub bit line SBL at the time when data is read becomes small, so that the reading transistor cannot respond accurately.

Operation of the semiconductor memory device illustrated in FIG. 1 is described with reference to FIGS. 3A to 3C, FIGS. 4A to 4C, and FIGS. 5A to 5C. Note that in circuit diagrams showing the operation of this specification, a transistor in an off-state is expressed by a transistor symbol overlapped with an x; a transistor in an on-state is expressed by a transistor symbol overlapped with a circle; the selection line SL and the word line WL to which a potential (H) for turning on a transistor connected thereto is supplied are expressed by their reference signs with surrounding circles. Note that a potential for turning off the transistors connected to the lines is L.

First of all, writing operation will be described. The potential of the source of the reading transistor RTr_n_m is constant during the writing process, and is preferably set to +1 V or 0 V in accordance with the polarity and/or threshold value of the reading transistor RTr_n_m. That is, the potential of the source of the reading transistor RTr_n_m may be set to +1 V in the case where the reading transistor RTr_n_m is an n-channel transistor and its threshold value is +0.5 V, and may be set to 0 V in the case where the reading transistor RTr_n_m is a p-channel transistor and its threshold value is −0.5 V. The potential of a counter electrode of the capacitor of the memory cell is also set to an appropriate constant value (0 V here).

The potential of the source of the reading transistor RTr_n_m can also be set to a value different from the above condition; however, depending on the condition, current may flow between the source and the drain of the reading transistor RTr_n_m when writing is performed, which may cause an increase in power consumption or break of a circuit.

Here, a case is considered where data is written to the second memory cell in the n-th row and the m-th column, MC_n_m_2 in the cell. As illustrated in FIG. 3A, the potential of the main bit line MBL_m is set to 0 V or +1 V depending on data. Then, the potentials of the selection line SL_n and the word line WL_n_2 are set to H, so that the selection transistor STr_n_m and the transistor of the memory cell MC_n_m_2 are turned on.

As a result, the capacitor of the memory cell MC_n_m_2 is charged to the potential of the main bit line. At this time, the reading transistor RTr_n_m can remain off. After charging is completed, the potential of the word line WL_n_2 is set to L, so that the transistor of the memory cell MC_n_m_2 is turned off. Thus, data writing is completed.

In the case of writing data to another memory cell of the cell in the n-th row and the m-th column, writing may be performed in a manner similar to the above-described manner by changing the potentials of the word line and the main bit line MBL_m which are connected to the memory cell. During the writing, the selection transistor STr_n_m may be kept on.

When writing to the cell in the n-th row and the m-th column is completed, the potential of the main bit line MBL_m is set to 0 V or +1 V in accordance with the polarity and/or threshold value of the reading transistor RTr_n_m, as shown FIG. 3B. That is, the potential of the source of the reading transistor RTr_n_m is set to 0 V in the case where the reading transistor RTr_n_m is an n-channel transistor and its threshold value is +0.5 V, and is set to +1 V in the case where the reading transistor RTr_n_m is a p-channel transistor and its threshold value is −0.5 V. Since the selection transistor STr_n_m is on, the potential of the sub bit line SBL_n_m becomes equal to the potential of the main bit line MBL_m.

Then, as shown in FIG. 3C, the potential of the selection line SL_n is set to L, so that the selection transistor STr_n_m is turned off. As a result, the potential of the sub bit line SBL_n_m is held at 0 V (when the reading transistor RTr_n_m is an n-channel transistor) or +1 V (when the reading transistor RTr_n_m is a p-channel transistor).

Meanwhile, a potential of +1 V or 0 V is supplied to the main bit line MBL_m, in order to write data to a cell in another row. When the potential of the sub bit line SBL_n_m is in the above condition, the reading transistor RTr_n_m can be kept off regardless of the potential of the main bit line MBL_m.

It is to be noted here that, in the case where writing operation is performed in one of the cells connected to the main bit line MBL_m, when the potential of the sub bit line SBL_n_m is not held at a potential that keeps the reading transistor RTr_n_m off, some current flows between the source and the drain of the reading transistor RTr_n_m, which causes a loss in electric power and may lead to burnout of a circuit in an extreme case. In particular, when the leakage current of the selection transistor STr_n_m is large, the possibility that the potential of the sub bit line SBL_n_m becomes different from the original potential is increased.

In order to avoid such a situation, it is preferable that the selection transistor STr_n_m be formed using an oxide semiconductor with significantly high off-resistance. However, in the case where an oxide semiconductor cannot be used for some reasons (for example, because the on-current of a transistor including an oxide semiconductor is not sufficiently large, or the like) and the off-resistance cannot be sufficiently high, it is preferable that the potential of the sub bit line SBL_n_m be set to the above appropriate value every time writing to another cell is performed or at certain intervals.

In other words, when writing to another cell is performed, a pulse for setting the potential of a sub bit line SBL to a predetermined value is supplied to the main bit line MBL_m as shown in FIG. 3B, in addition to a signal pulse for writing data to a capacitor of a memory cell, thus, the potential of the sub bit line SBL_n_m can be set to an appropriate value utilizing this timing by turning on/off the selection transistor STr_n_m.

Note that in a period in which writing is not performed in any cell, it is preferable that both the potential of the main bit line MBL_m and the potential of the source of the reading transistor RTr_n_m be set to 0 V (in the case where the reading transistor RTr_n_m is an n-channel transistor) or +1 V (in the case where the reading transistor RTr_n_m is a p-channel transistor). Accordingly, the reading transistor RTr_n_m is off at the time when writing is resumed or reading is started.

Alternatively, both the potential of the main bit line MBL_m and the potential of the source of the reading transistor RTr_n_m may be set to +1 V (in the case where the reading transistor RTr_n_m is an n-channel transistor) or 0 V (in the case where the reading transistor RTr_n_m is a p-channel transistor). In that case, before writing is resumed or reading is performed, it is preferable that the potential of the sub bit line SBL be set to 0 V (in the case where the reading transistor RTr_n_m is an n-channel transistor) or +1 V (in the case where the reading transistor RTr_n_m is a p-channel transistor) in all the cells.

Next, reading from the memory cell MC_n_m_2 will be described. Although two methods are described below, reading can also be performed using other methods. First, a method shown in FIGS. 4A to 4C will be described. Here, the reading transistor RTr_n_m is an n-channel transistor, and the resistance between the source and the drain at the potential difference between the gate and the source ((the potential of the gate)−(the potential of the source)) of +0.4 V is 100 times as large as that at +0.6 V.

Note that although, strictly speaking, the wiring resistance of the main bit line MBL_m also needs to be considered, the wiring resistance of the main bit line MBL_m need not be particularly considered here because it is about one tenth of the resistance of the reading transistor RTr_n_m of when the potential difference between the gate and the source is +0.6 V.

Further, the capacitance of the capacitor of the memory cell MC_n_m_2 is one fourth of the sum of the parasitic capacitance of the sub bit line SBL_n_m and the capacitance of the reading transistor RTr_n_m (including the gate capacitance and parasitic capacitance). Note that in the memory device of this embodiment, the capacitance of the capacitor of the memory cell MC is preferably 20% or more of the sum of the parasitic capacitance of the sub bit line SBL and the capacitance of the reading transistor RTr (including the gate capacitance and parasitic capacitance).

First, the potential of the source of the reading transistor RTr_n_m is set to +1 V, and the potential of the main bit line MBL_m is set to +0.5 V as shown in FIG. 4A. Then, the potential of the selection line SL_n is set to H so that the selection transistor STr_n_m is turned on. The potential of the sub bit line SBL_n_m becomes +0.5 V.

Next, the potential of the selection line SL_n is set to L so that the selection transistor STr_n_m is turned off. As a result, the potential of the sub bit line SBL_n_m is held at +0.5 V. Further, a resistor R is connected to the end of the main bit line MBL_m, as shown in FIG. 4B. The resistance value $R_M$ of the resistor R satisfies the condition, $R_L < R_M < R_H$. Here, $R_L$ is the resistance value between the source and the drain of the reading transistor RTr_n_m at the potential difference between the gate and the source of +0.6 V, and $R_H$ is that at +0.4 V. For example, it is assumed that $R_M = R_H/10$ and $R_M = 10 R_L$. The potential of an end of the resistor on the opposite side from the main bit line MBL_m is set to +1 V. The potential of the source of the reading transistor RTr_n_m is set to 0 V.

After that, as shown in FIG. 4C, the potential of the word line WL_n_2 is set to H, so that the transistor of the memory cell MC_n_m_2 is turned on. As a result, the potential of the sub bit line SBL_n_m changes. Since the selection transistor STr_n_m is off, only the capacitance of the capacitor of the memory cell MC_n_m_2, the parasitic capacitance of the sub bit line SBL_n_m, and the capacitance of the reading transistor RTr_n_m may be considered here as for potential change.

Since the capacitance of the capacitor of the memory cell MC_n_m_2 is one fourth of the sum of the parasitic capacitance of the sub bit line SBL_n_m and the capacitance of the reading transistor RTr_n_m as described above, the potential of the sub bit line SBL_n_m is either +0.4 V or +0.6 V.

Note that when the transistor of the memory cell MC_n_m_2 is on, the potential of the sub bit line SBL_n_m is influenced by the potential of the word line WL_n_2 through the gate capacitance of the transistor. This phenomenon becomes obvious when the sum of the capacitance of the capacitor, the parasitic capacitance of the sub bit line SBL_n_m, and the capacitance of the reading transistor RTr_n_m is five times as large as or less than the gate capacitance of the transistor of the memory cell MC_n_m_2.

Accordingly, particularly in the case where the capacitance of the capacitor is almost equal to or less than the gate capacitance of the transistor of the memory cell MC_n_m_2, it is preferable that the potential of the word line WL_n_2 be set to L so that the transistor of the memory cell MC_n_m_2 is turned off, after electric charge accumulated in the capacitor is released to the sub bit line SBL_n_m.

In the case where the potential of the sub bit line SBL_n_m is +0.4 V, since the resistance value of the reading transistor RTr_n_m is ten times as large as that of the resistor R, the potential of the main bit line MBL_m becomes +0.9 V. On the other hand, in the case where the potential of the sub bit line SBL_n_m is +0.6 V, since the resistance value of the reading transistor RTr_n_m is one tenth of that of the resistor R, the potential of the main bit line MBL_m becomes +0.1 V. In this manner, the potential of the main bit line greatly changes in accordance with the electric charge of the capacitor of the memory cell; thus, data can be read by detecting the change.

Note that in the case where reading from a cell in another row is performed, the potential of the sub bit line SBL_n_m is held at 0 V or a value close to 0 V, as in the writing, so that the reading transistor RTr_n_m is turned off.

In the above example, since change in the potential of the main bit line is sufficiently large, the potential change can be determined without using a sense amplifier. However, when the potentials of the sub bit lines of cells connected to the same column are not sufficiently low, the parallel resistance of the reading transistors of the cells cannot be ignored, and detection accuracy is decreased.

A similar circuit can be formed also in the case where an n-channel transistor or a p-channel transistor is used instead of the resistor R. Further, a p-channel transistor can be used as the reading transistor RTr_n_m.

For example, a transistor having a conductivity type opposite to that of the reading transistor RTr_n_m can be used. When the reading transistor RTr_n_m is an n-channel transistor and its threshold value is +0.5 V, it is preferable that a p-channel transistor whose threshold value is −0.5 V be used, a source thereof be connected to the main bit line MBL_m, the potential of a drain thereof be set to +1 V, and the potential of a gate thereof be set to +0.6 V.

FIGS. 5A to 5C show another reading method. Here, the reading transistor RTr_n_m is an n-channel transistor and its threshold value is +0.5 V. The capacitance of the capacitor of the memory cell MC_n_m_2 is the same as that in the case of FIGS. 4A to 4C.

First, the potential of the main bit line MBL_m is set to +1 V, the selection line SL_n is controlled to turn on/off the selection transistor STr_n_m, and the sub bit line SBL_n_m is precharged to +1 V. FIG. 4A and the description thereof can be referred to for details. After that, the main bit line MBL_m is put in a floating state. The potential of the source of the reading transistor RTr_n_m is set to +1 V.

Next, as shown in FIG. 5A, the potential of the word line WL_n_2 is set to H, so that the transistor of the memory cell MC_n_m_2 is turned on. As a result, the potential of the sub bit line SBL_n_m changes. As in FIGS. 4A to 4C, the potential of the sub bit line SBL_n_m changes in accordance with the potential of the capacitor, and becomes +0.8 V when the potential of the capacitor is 0 V and is kept at +1 V when the potential of the capacitor is +1 V. FIG. 4C and the description thereof can be referred to for details.

Then, as shown in FIG. 5B, the potential of the source of the reading transistor RTr_n_m is lowered from +1 V to 0 V. By this operation, the reading transistor RTr_n_m is turned on and the potential of the main bit line MBL_m becomes 0 V.

After that, when the potential of the source of the reading transistor RTr_n_m is brought back to +1 V as shown in FIG. 5C, the potential of the main bit line MBL_m becomes +0.3 V or +0.5 V.

This is because the potential difference between the drain of the reading transistor RTr_n_m (the main bit line MBL_m) and the gate of the reading transistor RTr_n_m (the sub bit line SBL_n_m) does not become less than or equal to the threshold value. In the case where the potential of the sub bit line SBL_n_m is +0.8 V, the potential difference cannot be less than or equal to +0.5 V which is the threshold value, so that the potential of the main bit line MBL_m is raised to +0.3 V. Similarly, in the case where the potential of the sub bit line SBL_n_m is +1 V, the potential of the main bit line MBL_m is raised to +0.5 V.

In this case, the potential difference (0.2 V) that arises at the main bit line MBL_m depending on data is the potential difference of the sub bit line SBL_n_m. In this example, the potential difference depending on the data of the sub bit line SBL_n_m cannot be amplified as in the method in FIGS. 4A to 4C but can be transferred to the main bit line MBL_m.

Since the potential of the main bit line MBL_m is +0.3 V or +0.5 V and the difference therebetween is small as described above, the potential is preferably amplified by a sense amplifier. By amplification with the sense amplifier, these values can become 0 V and +1 V, respectively. It is to be noted here that a potential having the same phase as that of when data is written appears at the main bit line MBL_m.

In other words, in the method shown in FIGS. 5A to 5C, in the case where the potential of the main bit line MBL_m is "1" when data is written, the potential of the main bit line MBL_m when data is read is also "1". When the potential of the main bit line MBL_m is sufficiently amplified by the sense amplifier, data can be rewritten using the potential.

In the semiconductor memory device of this embodiment, data is destroyed by being read, and therefore the same data needs to be written. Accordingly, it is favorable that the potential of the main bit line MBL_m have the same phase.

In the case of FIGS. 4A to 4C, the potential of the main bit line MBL_m has opposite phases between in writing and reading. Therefore, it is necessary that the potential which appears at the main bit line MBL_m be inverted and writing be performed after that; thus, time and electric power for these operations are needed.

Embodiment 2

An example of a manufacturing method of a semiconductor memory device according to part of a technical idea of the present invention will be described with reference to FIGS. 6A to 6C and FIGS. 7A and 7B. Note that in this embodiment, only a general manufacturing process is described using cross-sectional views. Embodiment 5 or FIGS. 13A to 13E can be referred to for description of a layered structure of the semiconductor memory device.

First, by a known semiconductor processing technique, an element separation insulator 102 is formed over one surface of a substrate 101 of a single crystal semiconductor such as silicon, gallium arsenide, gallium phosphide, silicon carbide, germanium, or germanium silicide. Further, n-type or p-type impurity regions 103a to 103d and gates 104a and 104b of transistors are formed. In addition, a first interlayer insulator 105 is formed and first contact plugs 106a to 106e are formed (see FIG. 6A). A silicide layer may be provided on the surfaces of the impurity regions 103a to 103d so that conductivity is increased.

Here, the n-type impurity region 103c corresponds to the source of the reading transistor RTr_n_m in FIG. 1. Further, the gate 104a is the gate of the selection transistor STr_n_m and also serves as the selection line SL_n. The gate 104b is the gate of the reading transistor RTr_n_m.

The first contact plug 106a is connected to the drain of the selection transistor STr_n_m. The first contact plug 106e is connected to a drain of a selection transistor in the next row, STr_n+1_m (which also serves as the drain of the reading transistor RTr_n_m). The n-type impurity region 103c may be provided in parallel to the selection line SL_n.

Then, a first embedded insulator 107 and first layer wirings 108a to 108f are formed. For the first layer wirings 108a to 108f, copper may be used for an increase in conductivity. In that case, the first layer wirings 108a to 108f are preferably manufactured by a damascene method. The first layer wiring 108c is used for supplying a potential to the source of the reading transistor RTr_n_m. In addition, a second interlayer insulator 109 is formed and second contact plugs 110a to 110d are formed (see FIG. 6B).

Next, a second embedded insulator 111 and second layer wirings 112a to 112g are formed. Note that top surfaces of the second layer wirings 112c to 112f are in direct contact with an oxide semiconductor to be formed later or are in contact with the oxide semiconductor with a thin insulator provided therebetween; thus, the second layer wirings are preferably formed using a material suitable for the purpose. For example, it is preferable to use a material whose work function is smaller than the electron affinity of the oxide semiconductor, such as titanium or titanium nitride. The second layer wirings 112c and 112e each serve as a counter electrode of a capacitor of a memory cell.

Further, an insulator 113 is formed to a thickness of 6 nm to 20 nm. The capacitance of a capacitor of a memory cell is determined with the thickness and dielectric constant of the insulator 113. When the insulator 113 is thin, the capacitance of the capacitor is large, but at the same time, leakage current is also large. Since an increase in leakage current degrades data retention characteristics of the memory cell, the thickness of the insulator 113 is preferably 10 nm or more. As a material for the insulator 113, silicon oxide, silicon oxynitride, aluminum oxide, hafnium oxide, zirconium oxide, or the like can be used.

Then, oxide semiconductor layers 114a and 114b are formed. An oxide semiconductor in which indium accounts for 20 at. % or more of all metal elements is preferably used. At the time of the formation, attention needs to be paid to prevent from the entry of hydrogen, and deposition of the oxide semiconductor is preferably performed by a sputtering method where hydrogen and water in the atmosphere or in the target are sufficiently reduced.

Further, a gate insulator 115 is formed. As a material for the gate insulator 115, silicon oxide, silicon oxynitride, aluminum oxide, hafnium oxide, zirconium oxide, or the like can be used. The thickness of the gate insulator 115 is preferably 6 nm to 20 nm, more preferably 10 nm to 16 nm (see FIG. 6C).

After that, word lines 116a to 116d are formed. As a material for the word lines 116a to 116d, a material whose work function is larger than the electron affinity of the oxide semiconductor, such as tungsten, nickel, palladium, osmium, or platinum is preferably used. Alternatively, only part of the word lines 116a to 116d, which is in contact with the gate insulator 115 may be formed of such a material. In addition, a third interlayer insulator 117 is formed and third contact plugs 118a to 118e are formed (see FIG. 7A).

Figure 7A:
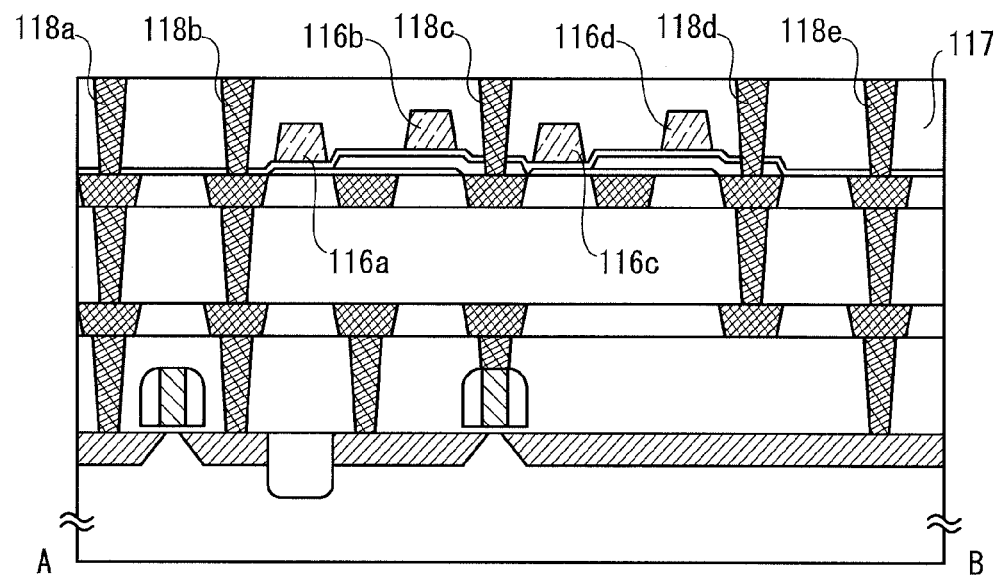
FIGS. 7A and 7B illustrate an example of a manufacturing process of a semiconductor memory device of the present invention.

Through the above steps, a first memory cell layer can be formed. In FIG. 7A, two memory cells are illustrated. The two memory cells are memory cells including transistors whose gates are the word lines 116b and 116d.

Hereinafter, an explanation on the memory cell including the transistor whose gate is the word line 116d is presented. The transistor of this memory cell is formed using the oxide semiconductor layer 114b. The second layer wiring 112e is a counter electrode of a capacitor of this memory cell. Although not clearly shown, part of the oxide semiconductor layer 114b, which faces the second layer wiring 112e corresponds to the other electrode of the capacitor.

When the surface of the second layer wiring 112e is formed using a material whose work function is smaller than the electron affinity of the oxide semiconductor, such as titanium or titanium nitride, electrons are induced in the oxide semiconductor layer 114b facing the second layer wiring 112e and the oxide semiconductor layer 114b exhibits n-type conductivity; thus, the oxide semiconductor layer 114b can be used as the electrode of the capacitor. Further, the second layer wiring 112f serves as a drain of the transistor of the memory cell.

The capacitor of the memory cell is a planar capacitor. Although the capacitance of the capacitor is thus small, it does not matter when the capacitance is 20% or more of the sum of the parasitic capacitance of the sub bit line and the capacitance of the reading transistor as described in Embodiment 1; thus, operation is not disturbed even when the capacitance of the capacitor is 0.1 fF or less, for example. In addition, because of the planar structure, it is easy to stack the memory cells, which is preferable for an increase in an integration degree.

Note that for an increase in the integration degree, the structure is effective in which the counter electrode (the second layer wiring 112e) of the capacitor is provided on a position opposite to the word line 116d with the oxide semiconductor layer 114b interposed therebetween. In addition, with this structure, parasitic capacitance between the word line 116d the second layer wiring 112f can be reduced with the integration degree maintained.

Figure 7B:
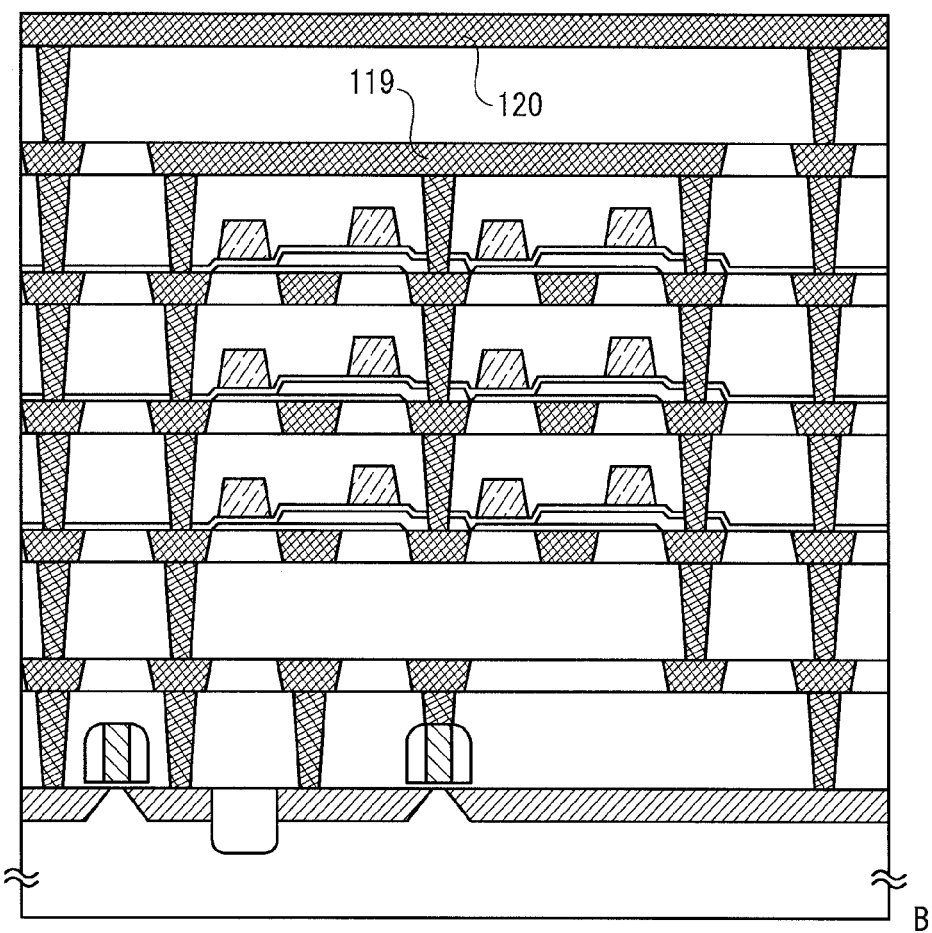

After that, a memory cell layer is stacked in a similar manner. For example, two more memory cell layers are stacked. Then, as shown in FIG. 7B, a wiring (a fifth layer wiring) 119 that connects the central three contact plugs (fifth contact plugs) provided in the uppermost memory cell layer is formed, and further, a wiring (a sixth layer wiring) 120 that connects the outer two contact plugs (sixth contact plugs) provided in an upper layer is formed.

The sixth layer wiring 120 serves as the main bit line MBL_m, and is connected to the impurity region 103a which serves as the drain of the selection transistor STr_n_m through the third contact plug 118a, the second layer wiring 112a, the second contact plug 110a, the first layer wiring 108a, the first contact plug 106a, and the like. Similarly, the sixth layer wiring 120 is connected to the impurity region 103d which serves as the drain of the selection transistor in the next row, STr_n+1_m through the third contact plug 118e, the second layer wiring 112g, the second contact plug 110d, the first layer wiring 108f, the first contact plug 106d, and the like.

The impurity region 103b; the first contact plug 106b; the first layer wirings 108b and 108e; the second contact plugs 110b and 110c; the second layer wirings 112b, 112d, and 112f; the third contact plugs 118b, 118c, and 118d; and the like are connected through the fifth layer wiring 119 so as to form the sub bit line SBL_n_m.

Although an oxide semiconductor is employed as the semiconductor used in the transistor of the memory cell in the above example, another kind of semiconductor may be alternatively used. For example, a polycrystalline or single crystal silicon film which is crystallized by irradiation with laser light may be used.

Embodiment 3

In this embodiment, an operation method of a semiconductor memory device, which is different from that in Embodiment 1, will be described with reference to FIGS. 8A to 8D. In this embodiment, the selection transistor is turned off only when reading is performed. Here, characteristics of the reading transistor and the capacitor of the memory cell are as described in Embodiment 1.

Figure 8A:
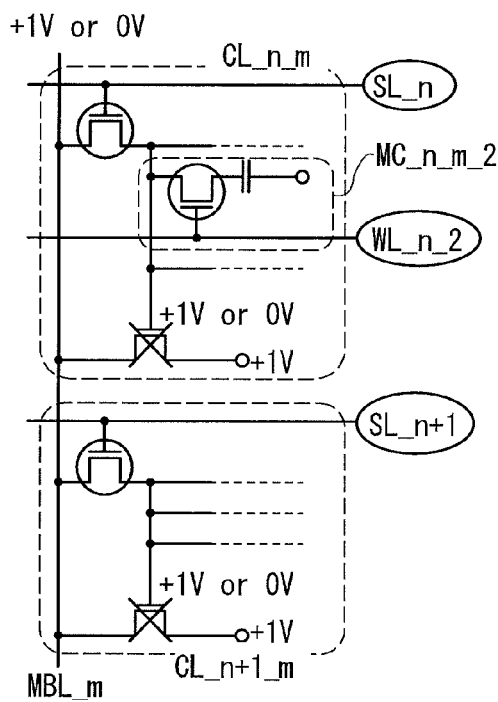
FIGS. 8A to 8D are diagrams illustrating an example of a driving method of a semiconductor memory device of the present invention.
Figure 8B:
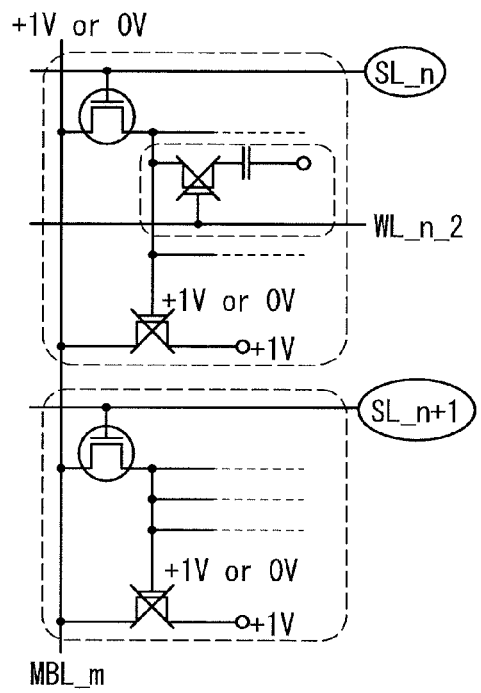
Figure 8C:
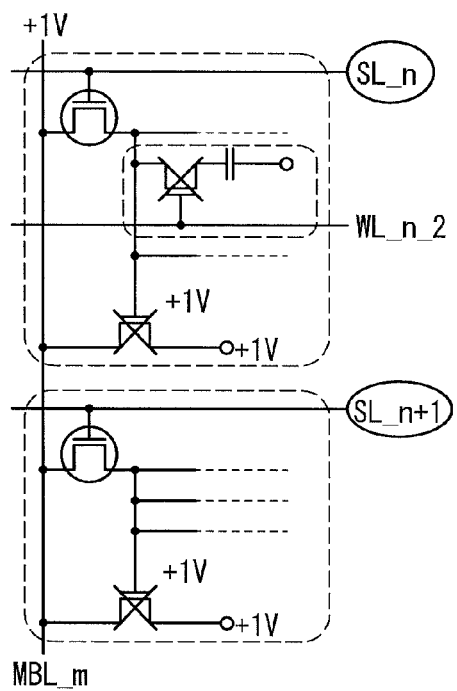
Figure 8D:
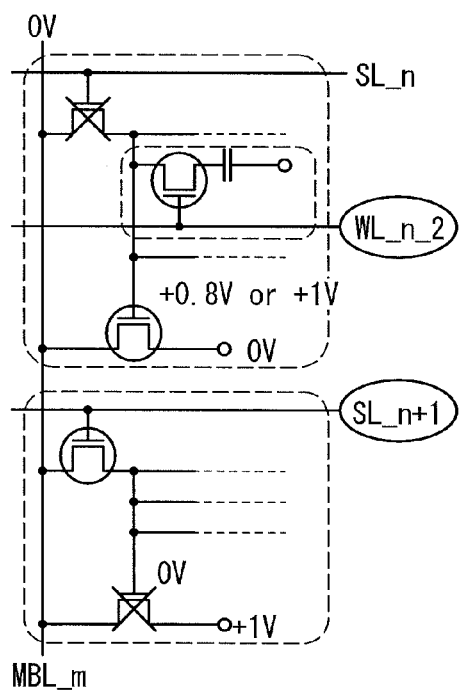

FIGS. 8A to 8D each show the state of the cell in the n-th row and the m-th column (CL_n_m) and a cell in the (n+1)-th row and the m-th column (CL_n+1_m), which is in the next row. FIGS. 8A and 8B each show part of the state of when writing is performed, and FIGS. 8C and 8D each show part of the state of when reading is performed. Although some components are not denoted by reference numerals in the drawing, Embodiment 1 may be referred to for details thereof.

First of all, writing operation will be described. As in the above description, the selection transistors STr_n_m and STr_n+1_m are turned on. In this state, the potential of the main bit line MBL_m is 0 V or +1 V depending on data. That is, the potential of the gate of each of the reading transistors RTr_n_m and RTr_n+1_m is 0 V or +1 V. However, since the potential of the source of each of the reading transistors RTr_n_m and RTr_n+1_m is +1 V, the reading transistors RTr_n_m and RTr_n+1_m are off regardless of the potential of the gate. Then, the potential of the word line WL_n_2 is set to H, and data is written to the memory cell MC_n_m_2 (see FIG. 8A).

After that, the potential of the word line WL_n_2 is set to L; thus, writing of data to the memory cell MC_n_m_2 is completed. Although the potential of the main bit line MBL_m becomes a potential corresponding to data written to another row, since the potential of the source of each of the reading transistors RTr_n_m and RTr_n+1_m is +1 V, the reading transistors RTr_n_m and RTr_n+1_m are off regardless of the potential of the gate (see FIG. 8B).

Next, reading operation will be described. Here, reading is performed using the method shown in FIGS. 5A to 5C. First, in order to precharge the sub bit line SBL_n_m to +1 V, the potential of the main bit line MBL_m is set to +1 V, and then the main bit line MBL_m is put in a floating state (see FIG. 8C). In this state, the reading transistors RTr_n_m and RTr_n+1_m are off.

After that, the selection transistor of the cell in the n-th row and the m-th column, STr_n_m where reading is performed is turned off. Then, the potential of the word line WL_n_2 is set to H, so that electric charge accumulated in the capacitor of the memory cell CL_n_m_2 is released to the sub bit line SBL_n_m. Thus, the potential of the sub bit line SBL_n_m becomes +0.8 V or +1 V. Description of FIG. 5B may be referred to for details of this operation.

After that, the potential of the source of the reading transistor RTr_n_m is set to 0 V. Thus, the reading transistor RTr_n_m is turned on, and the potential of the main bit line MBL_m becomes 0 V (see FIG. 8D). Description of FIG. 5B may be referred to for details of this operation.

Note that in the reading transistor RTr_n+1_m, the potential of the gate (which corresponds to the potential of a sub bit line SBL_n+1_m, and is equal to the potential of the main bit line MBL_m because the selection transistor STr_n+1_m is on) and the potential of the drain (the potential of the main bit line MBL_m) are equal to each other and lower than or equal to the potential of the source (+1 V); thus, the reading transistor RTr_n+1_m remains off. The other reading transistors in the same column are also off.

After that, the potential of the source of the reading transistor RTr_n_m is set to +1 V. As in the description of FIG. 5C, the potential of the main bit line MBL_m becomes +0.3 V or +0.5 V in accordance with the potential of the sub bit line SBL_n_m. After reading is completed, the selection transistor STr_n_m may be turned on.

In this method, in writing and reading operations, not only the parasitic capacitance of the main bit line MBL_m but also the parasitic capacitance of almost all the sub bit lines connected to the main bit line MBL_m needs to be counted as the wiring capacitance.

However, by a relatively easy operation as described above, the reading transistor can be surely kept off through almost all the periods of writing and reading by turning on the selection transistor.

Note that in the driving method described in this embodiment, as described above, not only the parasitic capacitance of the main bit line MBL_m but also the parasitic capacitance of almost all the sub bit lines connected to the main bit line MBL_m serves as wiring capacitance; thus, operation speed is correspondingly decreased. However, owing to an increase in wiring capacitance, even if the potential of the sub bit line is greatly changed by an adverse effect of noise, the potential of the sub bit line is leveled through the process in which electric charge is accumulated in the main bit line MBL_m and the like, and as a result, becomes less likely to be affected by noise.

Embodiment 4

Figure 9:
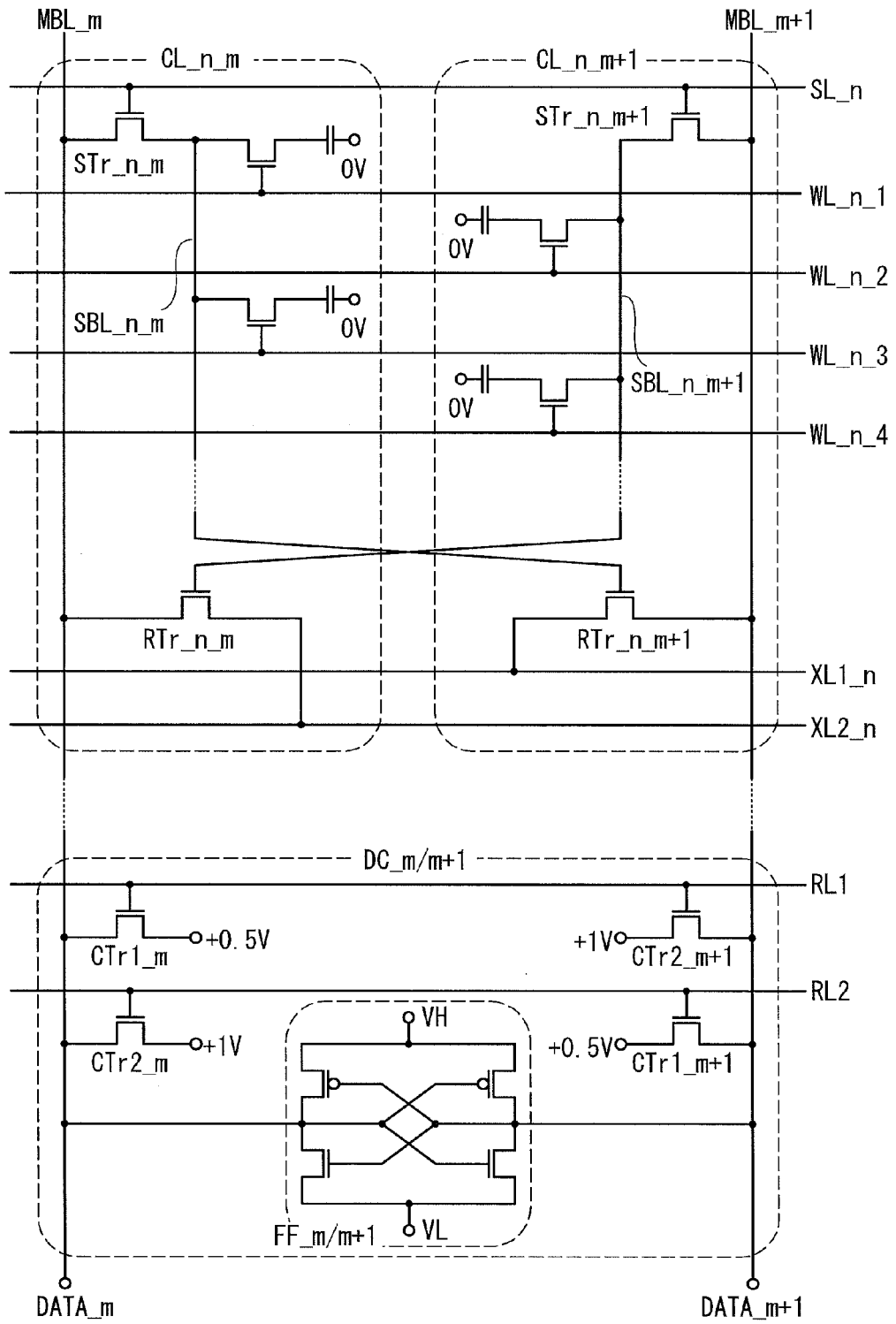
FIG. 9 is a diagram illustrating an example of a semiconductor memory device of the present invention.

In this embodiment, a semiconductor memory device illustrated in FIG. 9 and an operation example thereof are described. FIG. 9 shows a cell in the n-th row and the m-th column (CL_n_m), a cell in the n-th row and the (m+1)-th column (CL_n_m+1), and part of a driver circuit in the m-th column and the (m+1)-th column (DC_m/m+1) which are included in the semiconductor memory device.

The cell of the semiconductor memory device of this embodiment includes a selection transistor STr, a reading transistor RTr, a plurality of memory cells, and a sub bit line SBL. A drain of the selection transistor STr_n_m and a drain of the selection transistor STr_n_m+1 are respectively connected to a main bit line MBL_m and a main bit line MBL_m+1; a source of the selection transistor STr_n_m and a source of the selection transistor STr_n_m+1 are respectively connected to a sub bit line SBL_n_m and a sub bit line SBL_n_m+1; and both a gate of the selection transistor STr_n_m and a gate of the selection transistor STr_n_m+1 are connected to a selection line SL_n.

A drain of the reading transistor RTr_n_m and a drain of a reading transistor RTr_n_m+1 are respectively connected to the main bit line MBL_m and the main bit line MBL_m+1, a gate of the reading transistor RTr_n_m and a gate of the reading transistor RTr_n_m+1 are respectively connected to the sub bit line SBL_n_m+1 and the sub bit line SBL_n_m, and a source of the reading transistor RTr_n_m and a source of the reading transistor RTr_n_m+1 are respectively connected to a second power supply line XL2_n and a first power supply line XL1_n.

Further, the memory cell includes a transistor and a capacitor; one electrode of the capacitor and a source of the transistor are connected, and a drain of the transistor is connected to the sub bit line SBL. The other electrode of the capacitor is held at a fixed potential (here, 0 V).

Further, gates of the transistors of the memory cells are connected to the word lines WL in the following manner: the word line WL_n_1 is connected to one of the gates of the transistors of the memory cells in the cell in the n-th row and the m-th column but is not connected to any of the gates of the transistors of the memory cells in the cell in the n-th row and the (m+1)-th column; and the word line WL_n_2 is connected to one of the gates of the transistors of the memory cells in the cell in the n-th row and the (m+1)-th column but is not connected to any of the gates of the transistors of the memory cells in the cell in the n-th row and the m-th column.

That is, when the potential of one word line WL is H, as for a cell in the m-th column, and an adjacent cell in the (m+1)-th column, both of which the word line WL intersects, one of the cells has one memory cell in which the transistor is on, and the other cell does not have any memory cell in which the transistor is on.

The driver circuit includes first column transistors CTr1_m and CTr1_m+1, second column transistors CTr2_m and CTr2_m+1, and a flip-flop circuit FF_m/m+1.

Both a gate of the first column transistor CTr1_m and a gate of the second column transistor CTr2_m+1 are connected to a first column driver line RL1; a drain of the first column transistor CTr1_m and a drain of the second column transistor CTr2_m+1 are respectively connected to the main bit line MBL_m and the main bit line MBL_m+1; and a source of the first column transistor CTr1_m and a source of the second column transistor CTr2_m+1 are respectively held at +0.5 V and +1 V.

Both a gate of the second column transistor CTr2_m and a gate of the first column transistor CTr1_m+1 are connected to a second column driver line RL2; a drain of the second column transistor CTr2_m and a drain of the first column transistor CTr1_m+1 are respectively connected to the main bit line MBL_m and the main bit line MBL_m+1; and both a source of the second column transistor CTr2_m and a source of the first column transistor CTr1_m+1 are respectively held at +1 V and +0.5 V.

That is, when the potential of the first column driver line RL1 is set to H, the potentials of the main bit line MBL_m and the main bit line MBL_m+1 become +0.5 V and +1 V, respectively. When the potential of the second column driver line RL2 is set to H, the potentials of the main bit line MBL_m and the main bit line MBL_m+1 become +1 V and +0.5 V, respectively.

The main bit line MBL_m is connected to one terminal of the flip-flop circuit FF_m/m+1, and the main bit line MBL_m+1 is connected to the other terminal of the flip-flop circuit FF_m/m+1. Further, the main bit lines MBL_m and MBL_m+1 are respectively connected to data input-output terminals DATA_m and DATA_m+1.

A reading method of a semiconductor memory device having such a structure is described with reference to FIG. 10. Here, it is assumed that the capacitor of the memory cell which includes the transistor connected to the word line WL_n_1 in the cell in the n-th row and the m-th column is charged to +1 V (that is, data "1" is stored). Further, the capacitance of the capacitor of each of the memory cells is one fourth of the sum of the parasitic capacitance of the sub bit line SBL and the capacitance of the reading transistor RTr (including the gate capacitance and parasitic capacitance).

Further, it is assumed that the reading transistor RTr is an n-channel transistor with a threshold value of +0.5 V, and that the current between the source and the drain at the potential of the gate of +0.5 V is ten times as high as the current at the potential of the gate of +0.4 V (i.e., the resistance between the source and the drain is one tenth); and that the current between the source and the drain at the potential of the gate of +0.6 V is ten times as high as the current at the potential of the gate of +0.5 V.

Figure 10:
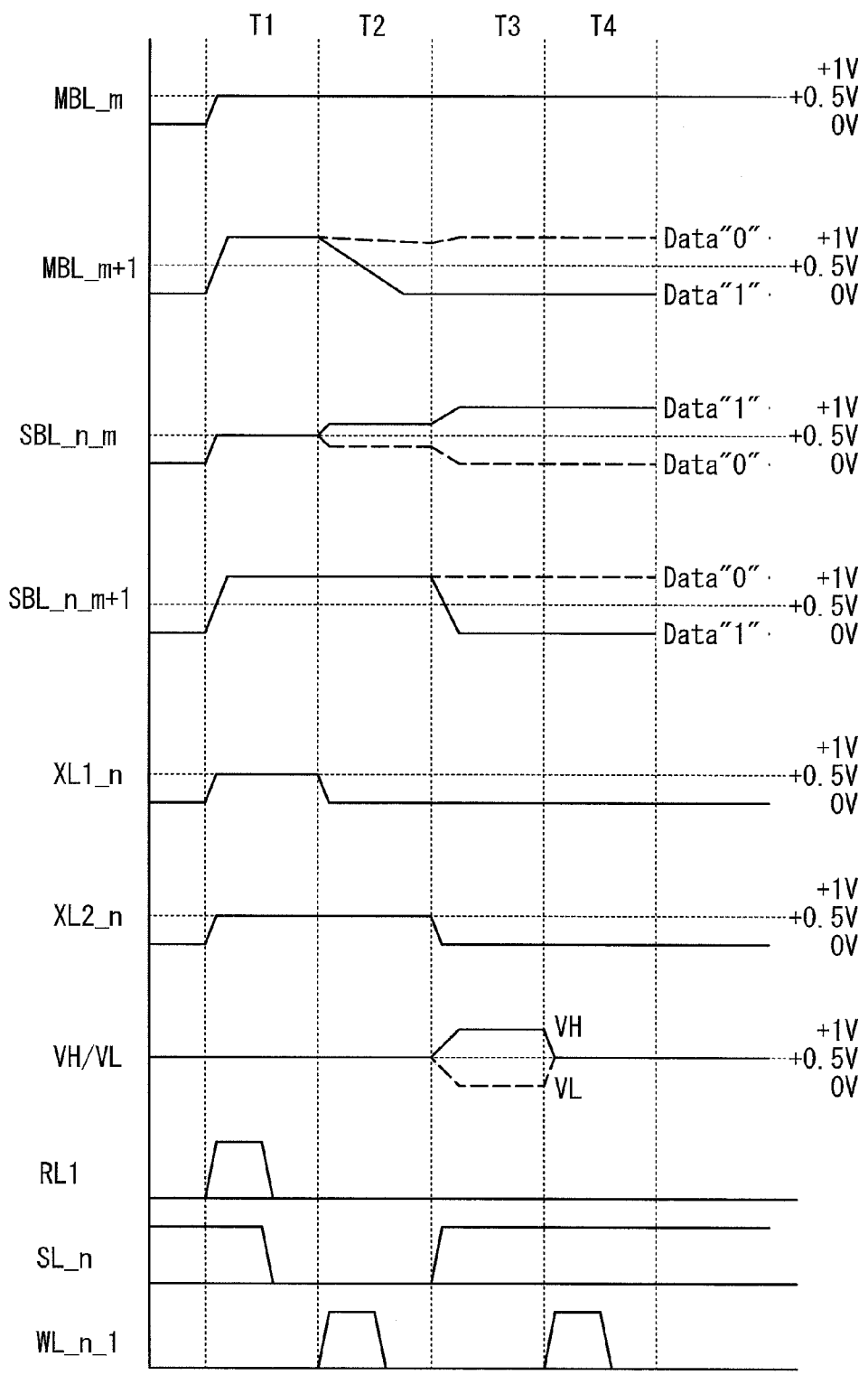
FIG. 10 is a diagram illustrating an example of a driving method of a semiconductor memory device of the present invention.

First, as shown in a period T1 in FIG. 10, the potentials of the first column driver line RL1 and the selection line SL_n are set to H, so that the first column transistor CTr1_m, the second column transistor CTr2_m+1, and the selection transistors STr_n_m and STr_n_m+1 are turned on.

As a result, the potentials of the main bit line MBL_m and the sub bit line SBL_n_m and the potentials of the main bit line MBL_m+1 and the sub bit line SBL_n_m+1 respectively become +0.5 V and +1 V. Further, the potentials of the first power supply line XL1_n and the second power supply line XL2_n are set to +0.5 V. This is in order to prevent conduction between the source and the drain of the reading transistor RTr.

In the reading transistor RTr_n_m, the potential of the gate is +1 V and the potentials of the source and the drain are +0.5 V; thus, current does not flow between the source and the drain. Further, in the reading transistor RTr_n_m+1, the potential of the gate is +0.5 V, the potential of the source is +0.5 V, and the potential of the drain is +1 V; thus, current does not flow between the source and the drain as well.

Note that the power supply potentials of the flip-flop circuit FF_m/m+1, a high potential VH and a low potential VL, are both set to +0.5 V, so that the flip-flop circuit FF_m/m+1 does not operate. Then, the potentials of the first column driver line RL1 and the selection line SL_n are set to L, so that the first column transistor CTr1_m, the second column transistor CTr2_m+1, and the selection transistors STr_n_m and STr_n_m+1 are turned off.

After that, as shown in a period T2 in FIG. 10, the potential of the word line WL_n_1 is set to H. In addition, the potential of the first power supply line XL1_n is set to 0 V. Since the cell in the n-th row and the m-th column includes the memory cell which includes the transistor connected to the word line WL_n_1, this transistor is turned on, so that electric charge accumulated in the capacitor is released and the potential of the sub bit line SBL_n_m changes. Here, the potential of the capacitor is +1 V; thus, the potential of the sub bit line SBL_n_m becomes +0.6 V according to the ratio of the capacitance of the capacitor and the capacitance of the sub bit line and the like.

As a result, the resistance of the reading transistor RTr_n_m+1 is decreased, and the potential of the main bit line MBL_m+1 is drastically decreased. On the other hand, the cell in the n-th row and the (m+1)-th column does not have any memory cell which includes a transistor connected to the word line WL_n_1; thus, the potential of the sub bit line SBL_n_m+1 does not change and remains at +1 V. Further, the potential of the main bit line MBL_m remains at +0.5 V. After that, the potential of the word line WL_n_1 is set to L.

Time for the potential of the sub bit line SBL_n_m to be stable is proportional to the product of the on-resistance of a transistor connected to the word line WL_n_1 and the capacitance of the sub bit line SBL_n_m. The capacitance of the sub bit line can be 1 fF or less, which is smaller than or equal to one several hundredth of the capacitance of a bit line of a conventional DRAM. Thus, even when the on-resistance of the transistor is several hundred times as high as that of a transistor using silicon, which is generally used in a conventional DRAM, the time is almost the same as that in the case of a conventional DRAM. The potential of the sub bit line SBL_n_m can be stable in a shorter time by making the capacitance of the sub bit line SBL_n_m smaller.

For example, even with a transistor using an oxide semiconductor, whose on-resistance is several ten times to several hundred times as high as that of a transistor using silicon (that is, the field-effect mobility of the oxide semiconductor is one several tenth to one several hundredth of that of the silicon), reading can be performed at almost the same speed as a conventional DRAM, or at higher speed than a conventional DRAM.

Then, as shown in a period T3 in FIG. 10, the potential of the selection line SL_n is set to H, and the potential of the second power supply line XL2_n is set to 0 V. Further, the high power supply potential of the flip-flop circuit FF_m/m+1 is set to +1 V and the low power supply potential is set to 0 V. Note that as shown in FIG. 10, the potential of the selection line SL_n is preferably set to H except partly in the period T1 and the period T2.

The flip-flop circuit FF_m/m+1 amplifies the potential difference between the main bit lines MBL_m and MBL_m+1. In other words, since the potential of the main bit line MBL_m+1 is almost 0 V whereas the potential of the main bit line MBL_m is +0.5 V, the flip-flop circuit FF_m/m+1 sets the potential of the main bit line MBL_m to +1 V and the potential of the main bit line MBL_m+1 to 0 V.

At this time, when the potentials of the first power supply line XL1_n and the second power supply line XL2_n are both 0 V, conduction between the source and the drain of the reading transistor RTr can be prevented. This is because, although the potential of the sub bit line SBL is equal to the potential of the main bit line MBL here because the selection transistor STr is on, the potentials of the gate and the drain of the reading transistor have opposite phases to each other (i.e., 0 V and +1 V or +1 V and 0 V) at that time.

In the case of reading data, the potential of the data input-output terminal DATA_m at this point may be measured. Note that a potential measured at the data input-output terminal DATA_m+1 has a phase opposite to that of the potential of the data input-output terminal DATA_m. In other words, when the potential of the data input-output terminal DATA_m is +1 V, the potential of the data input-output terminal DATA_m+1 is 0 V, and when the potential of the data input-output terminal DATA_m is 0 V, the potential of the data input-output terminal DATA_m+1 is +1 V.

Then, as shown in a period T4 in FIG. 10, the power supply potentials VH and VL of the flip-flop circuit FF_m/m+1 are both set to +0.5 V, and the potential of the word line WL_n_1 is set to H. As a result, the capacitor of the memory cell which includes the transistor connected to the word line WL_n_1 (in this case, a memory cell in the cell in the n-th row and the m-th column) is charged with the potential of the sub bit line SBL.

In this case, data "1" which is the same data as that originally written is written. In the case of rewriting data, the potential of the data input-output terminal DATA_m may be set to a potential corresponding to data to be written. Further, in that case, when the potential of the data input-output terminal DATA_m+1 is set to that of opposite phase, conduction between the source and the drain of the reading transistor RTr can be prevented.

Although the potential of the capacitor of the memory cell is set to +1 V in the above example, similar operation can be performed also in the case where the original potential of the capacitor is 0 V (data "0" is stored, see the dotted lines in FIG. 10). In that case, in the above period T2, the potential of the sub bit line SBL_n_m becomes +0.4 V, so that the resistance of the reading transistor RTr_n_m+1 is 100 times as large as that of when data "1" is stored; thus, the potential of the main bit line MBL_m+1 is hardly decreased from the original potential +1 V.

That is, the potential of the main bit line MBL_m (+0.5 V) is lower than the potential of the main bit line MBL_m+1 (a little lower than +1 V). Accordingly, in the period T3, the potential of the main bit line MBL_m becomes 0 V and the potential of the main bit line MBL_m+1 becomes +1 V when the flip-flop circuit FF_m/m+1 is operated.

In the semiconductor memory device of this embodiment, the level of the on-resistance (or field-effect mobility) of the transistor of the memory cell is not such a significant problem in reading and writing of data, and for example, a semiconductor material, such as an oxide semiconductor, whose mobility is several tenth to several hundredth of that of a silicon semiconductor may be used. This can be explained as follows.

In a conventional DRAM, time needed for writing is proportional to the sum (A1+A2) of the product (A1) of the capacitance of the main bit line and the resistance of the main bit line and the product (A2) of the capacitance of the capacitor of the memory cell and the on-resistance of the transistor of the memory cell. Note that in general, A2 is equal to or more than A1 and is ten times as large as or less than A1.

On the other hand, in this embodiment, time needed for writing is proportional to the sum (B1+B2+B3) of the product (B1) of the capacitance of the main bit line and the resistance of the main bit line, the product (B2) of the capacitance of the sub bit line and the on-resistance of the selection transistor, and the product (B3) of the capacitance of the capacitor of the memory cell and the on-resistance of the transistor of the memory cell.

When these are compared, A1 and B1 can be regarded as equivalent to each other. In the case where A2 and B2 are compared, when each transistor uses a silicon semiconductor, the transistors have equivalent on-resistance. Meanwhile, the capacitance of the sub bit line can be 1 fF or less, preferably 0.1 fF or less in this embodiment, whereas the capacitance of the capacitor of the conventional DRAM is 10 fF or more; thus, B2 can be less than or equal to one tenth, preferably one hundredth of A2.

In addition, as for B3, even if the on-resistance of an oxide semiconductor is 100 times as high as that of a silicon semiconductor for example, when the capacitance of the capacitor is set to be less than or equal to 0.1 fF, which is less than or equal to one hundredth of the capacitance of the capacitor of the conventional DRAM, B3 is equivalent to or less than or equal to A2.

As is apparent from the above consideration, by using a sub bit line with sufficiently small capacitance and sufficiently reducing the capacitance of the capacitor, writing speed comparable to that of a conventional DRAM can be realized even when a transistor having extremely high on-resistance (extremely small field-effect mobility) is used. Reading can also be performed at almost the same speed as in a conventional DRAM, according to similar consideration.

Refresh operation is substantially unnecessary in the case where an oxide semiconductor with a large band gap is used, which leads to an effect of reducing power consumption; however, it is not practical to only use an oxide semiconductor with a large band gap for a transistor of a memory cell of a conventional DRAM because operation speed is significantly decreased.

However, as described in this embodiment, by using a sub bit line with sufficiently small capacitance and sufficiently reducing the capacitance of the capacitor, operation speed comparable to that of a conventional DRAM can be realized, and a novel semiconductor memory device in which refresh operation is substantially unnecessary can be realized.

In the semiconductor memory device of this embodiment, the sub bit line has extremely small capacitance, so that the potential thereof is likely to be affected by noise. Accordingly, the conduction state of the reading transistor whose gate is connected to the sub bit line is also affected by noise. However, since such an adverse effect of noise is leveled through the process in which electric charge is accumulated in the main bit line which has larger capacitance and other sub bit lines, the adverse effect of noise can be suppressed as a result.

Embodiment 5

Figure 11:
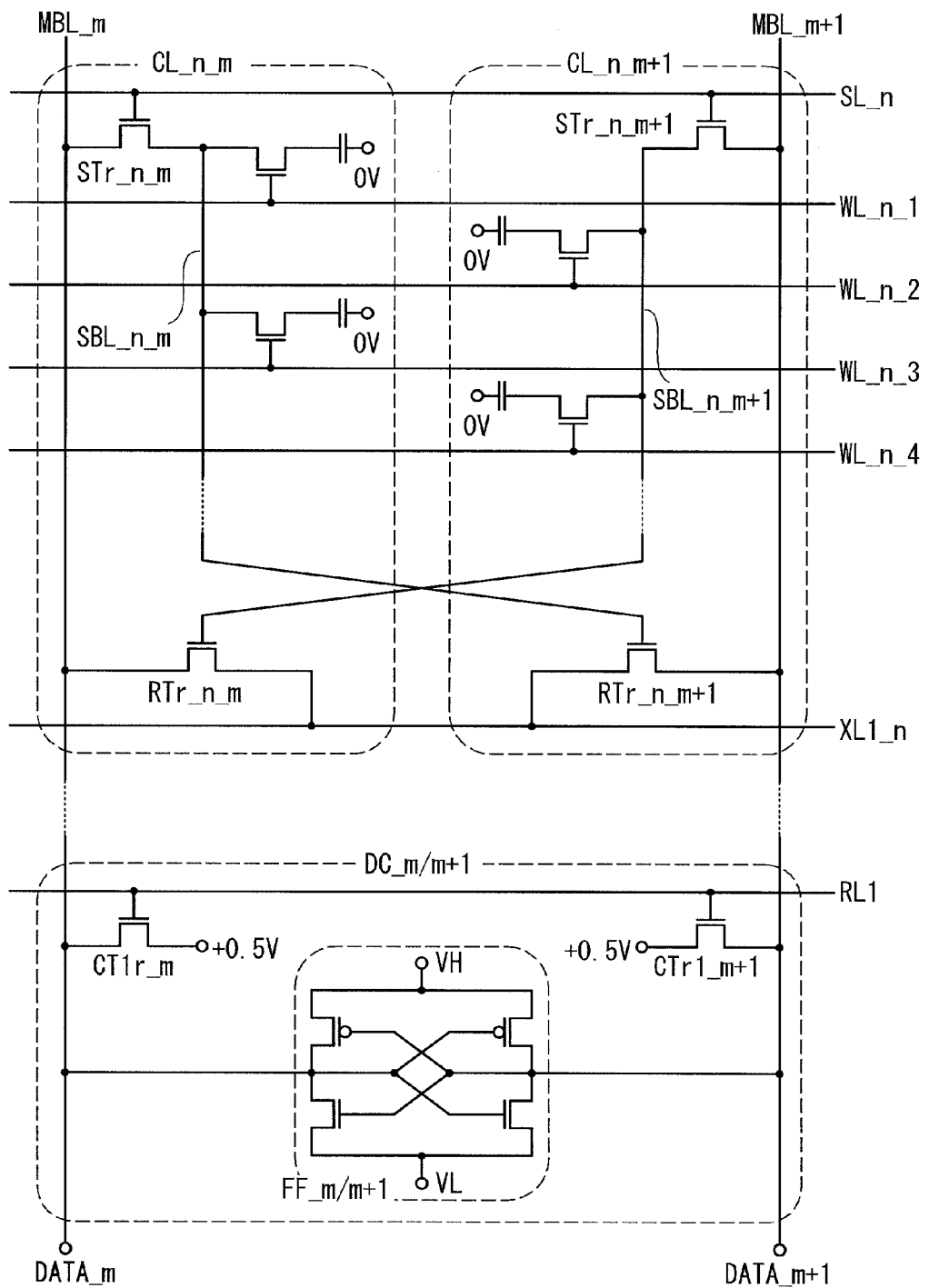
FIG. 11 is a diagram illustrating an example of a semiconductor memory device of the present invention.

In this embodiment, a semiconductor memory device illustrated in FIG. 11 and an operation example thereof are described. The semiconductor memory device shown in FIG. 11 includes the simpler driver circuit than that shown in FIG. 9. FIG. 11 shows a cell in the n-th row and the m-th column (CL_n_m), a cell in the n-th row and the (m+1)-th column (CL_n_m+1), and part of a driver circuit in the m-th column and the (m+1)-th column (DC_m/m+1) which are included in the semiconductor memory device. Here, m is an odd number.

The cell of the semiconductor memory device of this embodiment includes a selection transistor STr, a reading transistor RTr, a plurality of memory cells, and a sub bit line SBL, similarly to the cell of the semiconductor memory device shown in FIG. 9. The cell of the semiconductor memory device of this embodiment is different from the cell of the semiconductor memory device shown in FIG. 9 in that a source of the reading transistor RTr in the even-numbered column and a source of the reading transistor RTr in the odd-numbered column are connected to a same power supply line (i.e., the first power supply line XL1_n).

The driver circuit includes at least a first column transistors CTr1_m and CTr1_m+1 and a flip-flop circuit FF_m/m+1. Both a gate of the first column transistor CTr1_m and a gate of the first column transistor CTr1_m+1 are connected to a first column driver line RL1; a drain of the first column transistor CTr1_m and a drain of the first column transistor CTr1_m+1 are respectively connected to the main bit line MBL_m and the main bit line MBL_m+1; and both a source of the first column transistor CTr1_m and a source of the first column transistor CTr1_m+1 are held at +0.5 V. That is, when the potential of the first column driver line RL1 is set to H, the potentials of the main bit line MBL_m and the main bit line MBL_m+1 both become +0.5 V.

The connections between the flip-flop circuit FF_m/m+1 and the main bit lines MBL_m and MBL_m+1 are the same as those in the semiconductor memory device shown in FIG. 9.

FIGS. 13A to 13E show an example of layout of main layers included in the cell of the semiconductor memory device shown in FIG. 11. Note that the line A-B in each of FIGS. 13A to 13E corresponds to the line A-B in each of FIGS. 6A to 6C and FIGS. 7A and 7B along which the cross-sectional views are taken. Thus, FIGS. 6A to 6C and FIGS. 7A and 7B and description thereof may be referred to for details.

Figure 13A:
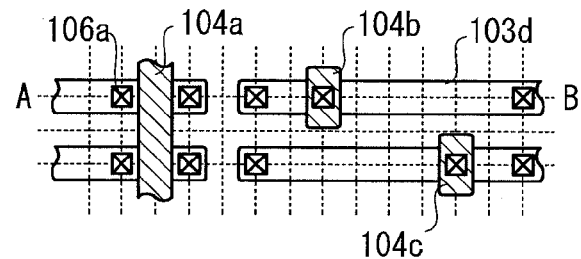
FIGS. 13A to 13E are diagrams illustrating an example of a semiconductor memory device of the present invention.

FIG. 13A shows the arrangement of the impurity region 103d and the like, the gates 104a to 104c, and the first contact plugs 106a and the like provided to be connected thereto. The vertical direction in the drawing is the direction of the word line.

The gate 104a serves as the selection line SL_n, and the gate 104b is the gate of the reading transistor RTr_n_m. The gate 104c is a gate of a reading transistor of an adjacent cell. As shown in FIG. 13A, the gates 104b and 104c are positioned so as not to overlap with each other in the word line direction, so that the distance between the cells can be reduced, which is preferable for high integration.

Figure 13B:
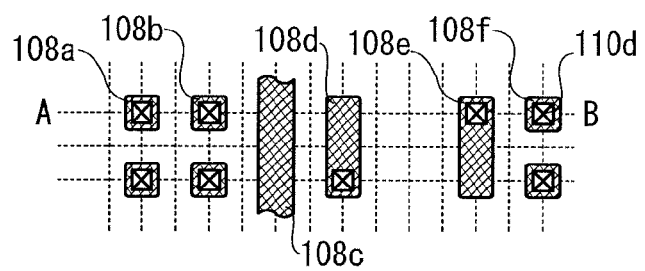

FIG. 13B shows the arrangement of the first layer wirings 108a to 108f formed thereover and the second contact plugs 110d and the like provided to be connected thereto. The first layer wiring 108c serves as the first power supply line XL1_n which supplies a potential to the source of the reading transistor. The first layer wiring 108e serves as part of the sub bit line SBL_n_m, and is connected to the gate of the reading transistor of the adjacent cell, and the first layer wiring 108d serves as part of a sub bit line of the adjacent cell and is connected to the gate of the reading transistor RTr_n_m.

Figure 13C:
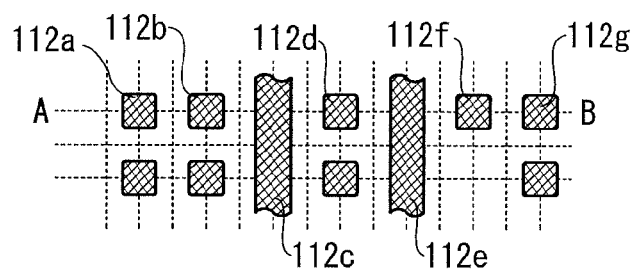
Figure 13D:
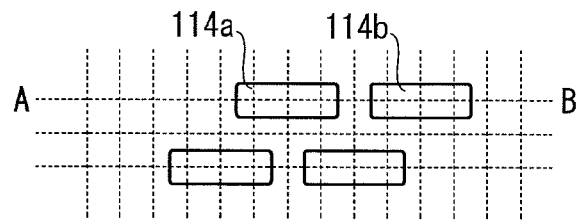
Figure 13E:
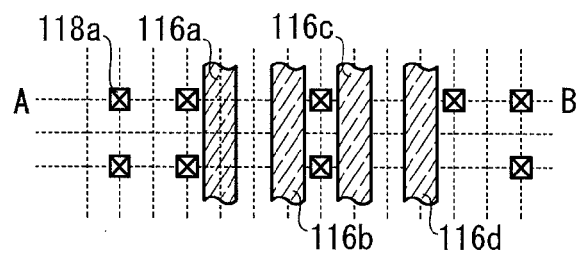

In FIG. 13C, positions of the second layer wirings 112a to 112g are illustrated. Among the second layer wirings 112a to 112g, the second layer wirings 112c and 112e each serve as a counter electrode of a capacitor of a memory cell. In FIG. 13D, positions of the oxide semiconductor layers 114a and 114b are illustrated. FIG. 13E illustrates positions of the word lines 116a to 116d, the third contact plug 118a, and the like.

A reading method of a semiconductor memory device having such a structure is described with reference to FIG. 12. Here, it is assumed that data "1" is stored in the memory cell which includes the transistor connected to the word line WL_n_1 in the cell in the n-th row and the m-th column. Further, the capacitance of the capacitor of each of the memory cells is one fourth of the sum of the parasitic capacitance of the sub bit line SBL and the capacitance of the reading transistor RTr (including the gate capacitance and parasitic capacitance).

Further, it is assumed that the reading transistor RTr is an n-channel transistor with a threshold value of +0.5 V, and that the current between the source and the drain at the potential of the gate of +0.5 V is ten times as high as the current at the potential of the gate of +0.4 V (i.e., the resistance between the source and the drain is one tenth); and that the current between the source and the drain at the potential of the gate of +0.6 V is ten times as high as the current at the potential of the gate of +0.5 V.

Figure 12:
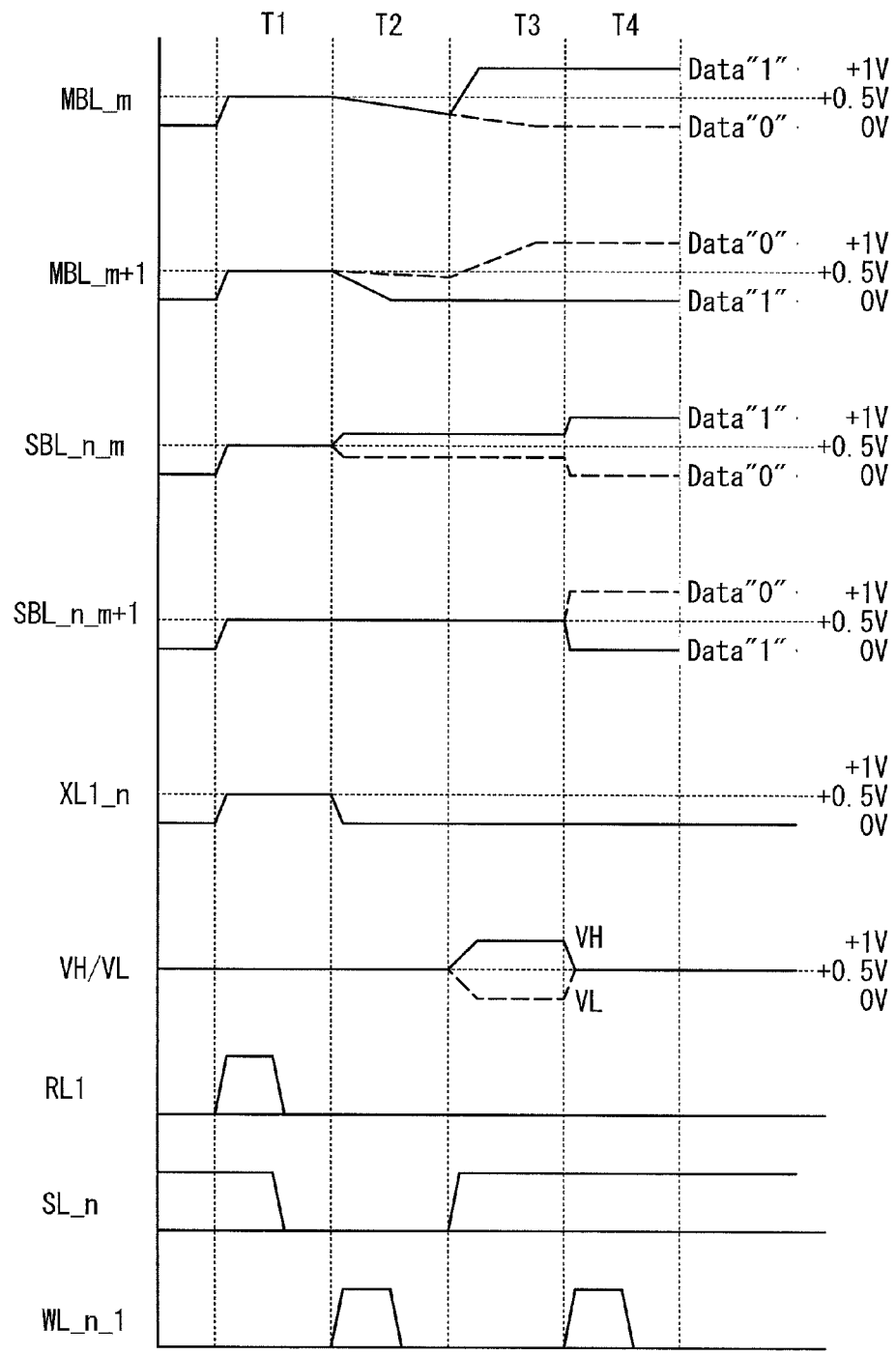
FIG. 12 is a diagram illustrating an example of a driving method of a semiconductor memory device of the present invention.

First, as shown in a period T1 in FIG. 12, the potentials of the first column driver line RL1 and the selection line SL_n are set to H, so that the first column transistors CTr1_m and CTr1_m+1 and the selection transistors STr_n_m and STr_n_m+1 are turned on.

As a result, the potentials of the main bit lines MBL_m and MBL_m+1 and the sub bit lines SBL_n_m and SBL_n_m+1 become +0.5 V. In addition, the potential of the first power supply line XL1_n is set to +0.5 V. This is in order to prevent conduction between the source and the drain of the reading transistor RTr. In the reading transistors RTr_n_m and RTr_n_m+1, the potentials of all the gates, the sources, and the drains are +0.5 V; thus, current does not flow between the source and the drain.

Note that the power supply potentials of the flip-flop circuit FF_m/m+1, a high potential VH and a low potential VL, are both set to +0.5 V, so that the flip-flop circuit FF_m/m+1 does not operate. Then, the potentials of the first column driver line RL1 and the selection line SL_n are set to L, so that the first column transistors CTr1_m and CTr1_m+1 and the selection transistors STr_n_m and STr_n_m+1 are turned off.

After that, as shown in a period T2 in FIG. 12, the potential of the word line WL_n_1 is set to H. In addition, the potential of the first power supply line XL1_n is set to 0 V. Since the cell in the n-th row and the m-th column includes the memory cell which includes the transistor connected to the word line WL_n_1, this transistor is turned on, so that electric charge accumulated in the capacitor is released and the potential of the sub bit line SBL_n_m changes. Here, the potential of the sub bit line SBL_n_m becomes +0.6 V. After that, the potential of the word line WL_n_1 is set to L.

As a result, the resistance of the reading transistor RTr_n_m+1 is decreased, and the potential of the main bit line MBL_m+1 is drastically decreased to approach 0 V. On the other hand, the cell in the n-th row and the (m+1)-th column does not have any memory cell which includes a transistor connected to the word line WL_n_1; thus, the potential of the sub bit line SBL_n_m+1 does not change and remains at +0.5 V. Since the resistance of the reading transistor RTr_n_m is ten times as large as the resistance of the reading transistor RTr_n_m+1, the decrease in the potential of the main bit line MBL_m is more gradual than that of the main bit line MBL_m+1.

Then, as shown in a period T3 in FIG. 12, the potential of the selection line SL_n is set to H, the high power supply potential of the flip-flop circuit FF_m/m+1 is set to +1 V, and the low power supply potential is set to 0 V.

The flip-flop circuit FF_m/m+1 amplifies the potential difference between the main bit lines MBL_m and MBL_m+1. In other words, since the potential of the main bit line MBL_m+1 is higher than the potential of the main bit line MBL_m, the flip-flop circuit FF_m/m+1 sets the potential of the main bit line MBL_m to +1 V and the potential of the main bit line MBL_m+1 to 0 V. At this time, when the potential of the first power supply line XL1_n is 0 V, conduction between the source and the drain of the reading transistor RTr can be prevented. In the case of reading data, the potential of the data input-output terminal DATA_m at this point may be measured.

Then, as shown in a period T4 in FIG. 12, the power supply potentials VH and VL of the flip-flop circuit FF_m/m+1 are both set to +0.5 V, and the potential of the word line WL_n_1 is set to H. As a result, the capacitor of the memory cell which includes the transistor connected to the word line WL_n_1 (in this case, a memory cell in the cell in the n-th row and the m-th column) is charged with the potential of the sub bit line SBL.

In this case, data "1" which is the same data as that originally written is written. In the case of rewriting data, the potential of the data input-output terminal DATA_m may be set to a potential corresponding to data to be written. Further, in that case, when the potential of the data input-output terminal DATA_m+1 is set to that of opposite phase, conduction between the source and the drain of the reading transistor RTr can be prevented.

Although data "1" is stored in the memory cell in the above example, reading and writing can be similarly performed also in the case where data "0" is stored (see the dotted lines in FIG. 12). In that case, in the above period T2, the potential of the sub bit line SBL_n_m becomes +0.4 V, so that the resistance of the reading transistor RTr_n_m+1 is 100 times as large as that of when data "1" is stored; thus, the potential of the main bit line MBL_m+1 is hardly decreased from the original potential +0.5 V.

Meanwhile, as in the above case where data "1" is stored, the potential of the sub bit line SBL_n_m+1 is +0.5 V, and the potential of the main bit line MBL_m+1 is decreased as in the above case where data "1" is stored. That is, the potential of the main bit line MBL_m is lower than the potential of the main bit line MBL_m+1. Accordingly, in the period T3, the potential of the main bit line MBL_m becomes 0 V and the potential of the main bit line MBL_m+1 becomes +1 V when the flip-flop circuit FF_m/m+1 is operated.

The semiconductor memory device of this embodiment performs data reading by detecting the difference in conduction state between the reading transistors RTr_n_m and RTr_n_m+1, and therefore is inferior in stability as compared with the semiconductor memory device shown in FIG. 9.

For example, the length of the period T2 needs to be set appropriately. When it is too short, at the time of reading data "0", and when it is too long, at the time of reading data "1", the potential difference between the main bit lines MBL_m and MBL_m+1 becomes so small that errors easily occur.

In addition, since the potential difference between the main bit lines MBL_m and MBL_m+1 is about 0.1 V to 0.3 V in the above example, it takes time to be amplified by the flip-flop circuit.

However, high integration is easily realized in the semiconductor memory device of this embodiment because the configuration of the driver circuit is simple, and wirings connected to the source of the reading transistor may be of a single kind (the first power supply line XL1).

This application is based on Japanese Patent Application serial no. 2010-225566 filed with Japan Patent Office on Oct. 5, 2010 and Japanese Patent Application serial no. 2010-274168 filed with Japan Patent Office on Dec. 9, 2010, the entire contents of which are hereby incorporated by reference.

What is claimed is:

1. A semiconductor memory device comprising:
one or more main bit lines;
one or more power supply lines;
four or more word lines; and
two or more cells,
wherein each of the cells includes a sub bit line, a selection transistor, a reading transistor, and two or more memory cells,
wherein a drain of the selection transistor and a drain of the reading transistor are connected to one of the main bit lines,
wherein a gate of the reading transistor is connected to the sub bit line,
wherein a source of the reading transistor is connected to one of the power supply lines, wherein each of the memory cells includes a transistor and a capacitor, wherein the capacitance of the capacitor is 1 fF or less, and wherein a gate of the transistor of one of the memory cells is connected to one of the word lines.

2. The semiconductor memory device according to claim 1, wherein the selection transistor and the transistor of one of the memory cells are provided in different layers.

3. The semiconductor memory device according to claim 1, wherein a semiconductor used for the selection transistor and a semiconductor used for the transistor of one of the memory cells are of different kinds.

4. The semiconductor memory device according to claim 1, wherein the transistor of one of the memory cells and the transistor of another memory cell are provided in different layers.

5. The semiconductor memory device according to claim 1, wherein a conductivity type of the reading transistor is different from a conductivity type of the selection transistor.

6. The semiconductor memory device according to claim 1, wherein each of the cells includes 2 to 32 memory cells.

7. The semiconductor memory device according to claim 1, wherein a depth or a height of the capacitor is 1 μm or less.

8. The semiconductor memory device according to claim 1, wherein the resistance in an off-state of the transistor is $1\times10^{24}\Omega$ or higher.

9. A semiconductor memory device comprising:
a first main bit line and a second main bit line;
one or more power supply lines;
four or more word lines;
a first cell and a second cell,
wherein the first cell includes a first sub bit line, a first selection transistor, a first reading transistor, and two or more memory cells,
wherein the second cell includes a second sub bit line, a second selection transistor, a second reading transistor, and two or more memory cells,
wherein a drain of the first selection transistor and a drain of the first reading transistor are connected to the first main bit line,
wherein a source of the first selection transistor and a gate of the second reading transistor are connected to the first sub bit line,
wherein a source of the first reading transistor is connected to one of the power supply lines,
wherein each of the memory cells includes a transistor and a capacitor,
wherein the capacitance of the capacitor is 1 fF or less, and
wherein a gate of the transistor of one of the memory cells is connected to one of the word lines.

10. The semiconductor memory device according to claim 9, wherein the first selection transistor and the transistor of one of the memory cells are provided in different layers.

11. The semiconductor memory device according to claim 9, wherein a semiconductor used for the first selection transistor and a semiconductor used for the transistor of one of the memory cells are of different kinds.

12. The semiconductor memory device according to claim 9, wherein the transistor of one of the memory cells and the transistor of another memory cell are provided in different layers.

13. The semiconductor memory device according to claim 9, wherein a conductivity type of the first reading transistor is different from a conductivity type of the first selection transistor.

14. The semiconductor memory device according to claim 9, wherein the first cell includes 2 to 32 memory cells.

15. The semiconductor memory device according to claim 9, wherein a depth or a height of the capacitor is 1 μm or less.

16. The semiconductor memory device according to claim 9, wherein the resistance in an off-state of the transistor is $1\times10^{24}\Omega$ or higher.

* * * * *